United States Patent [19]

Nagata et al.

[11] Patent Number: 5,470,778
[45] Date of Patent: Nov. 28, 1995

[54] METHOD OF MANUFACTURING A SEMICONDUCTOR DEVICE

[75] Inventors: Toshiyuki Nagata, Tsukuba; Hiroyuki Yoshida, Ryugasaki; Takayuki Niuya, Tsukuba; Yoshihiro Ogata; Katsushi Boku, both of Tsuchivra; Yoichi Miyai, Ibaraki, all of Japan

[73] Assignee: Texas Instruments Incorporated, Dallas, Tex.

[21] Appl. No.: 251,866

[22] Filed: May 31, 1994

Related U.S. Application Data

[62] Division of Ser. No. 889,323, May 27, 1992, Pat. No. 5,317,177.

[30] Foreign Application Priority Data

Jun. 7, 1991 [JP] Japan ................ 3-163912

[51] Int. Cl.[6] .............................. H01L 21/8242
[52] U.S. Cl. .............. 437/52; 437/60; 437/203; 437/919
[58] Field of Search .............. 437/47, 52, 60, 437/203, 919; 257/301, 302

[56] References Cited

U.S. PATENT DOCUMENTS

| 4,672,410 | 6/1987 | Miura et al. ........................ 257/302 |
| 4,673,962 | 6/1987 | Chatterjee et al. .................. 357/23.6 |
| 4,713,678 | 12/1987 | Womack et al. .................... 357/23.6 |
| 4,737,829 | 4/1988 | Morimoto et al. .................. 357/23.6 |
| 4,956,692 | 9/1990 | Ozaki et al. ........................ 357/49 |
| 5,028,980 | 7/1991 | Teng .................................. 357/51 |
| 5,103,276 | 4/1992 | Shen et al. ......................... 357/23.6 |
| 5,109,259 | 4/1992 | Banerjee ............................ 357/23.6 |
| 5,111,259 | 5/1992 | Teng et al. ......................... 357/23.6 |
| 5,317,177 | 5/1994 | Nagata et al. ...................... 257/301 |

FOREIGN PATENT DOCUMENTS

| 60-128658 | 7/1985 | Japan . |
| 3113466 | 5/1987 | Japan ................... 437/52 |
| 2-28968 | 1/1990 | Japan . |
| 3-259567 | 11/1991 | Japan ................... 257/301 |

*Primary Examiner*—Tom Thomas
*Attorney, Agent, or Firm*—Ira S. Matsil; James C. Kesterson; Richard L. Donaldson

[57] ABSTRACT

A semiconductor device in which a trench-shaped groove (20) and a depression (100), which is formed by removing at least part of the area above and adjacent to the groove, are formed to be continuous on one side of the semiconductor substrate, in which aforementioned groove and aforementioned depression is buried a polysilicon conductive layer (103), the top of which conductive layer is converted into an insulator (102), the bottom of which insulating film (102) is contained in the depression (100).

23 Claims, 20 Drawing Sheets

5,470,778

METHOD OF MANUFACTURING A SEMICONDUCTOR DEVICE

This is a division of application Ser. No. 07/889,323, filed May, 27, 1992, U.S. Pat. No. 5,317,177.

The present invention relates to a semiconductor device, such as a dynamic RAM (Random Access Memory), and a method for manufacturing it.

PRIOR ART

Conventionally, in a semiconductor integrated circuit device, such as a dynamic RAM, as shown in the memory unit of FIG. 31, for example, a trench-shaped groove (20) of a prescribed depth is formed on one side of a $p^{--}$-type silicon substrate (specifically, a $p^-$-type well (1) formed on a silicon substrate). This groove (20) is covered with an insulating film (25) and then filled with an $n^+$-type polysilicon (field plate) (43).

Next, an $n^+$-type diffusion area (34), which is diffusion-formed on the entire outside surface of the groove (20), is used as an electrode in forming a capacitor $C_1$. In addition, an $n^+$-type source area (33), which is linked to the $n^+$-type diffusion area (34), and an $n^+$-type drain area (22), which is connected to a bit line, are diffusion-formed on the other surface of the groove (20) in a prescribed pattern. A gate electrode (35), which serves as a word line, is situated in between these areas via a gate oxide film (17), thereby connecting an n-channel insulation gate field effect transistor (transfer gate) $Tr_1$, which is used in horizontal transmission. The source and drain areas are divided by a nitride film, with which a side wall technology is used.

The top (43a) of the field plate (43) projects above the groove (20), and is insulated and isolated from the bottom by the nitride film (51). In addition, it is insulated and isolated from the top by an $SiO_2$ film (52).

This field plate (43) is used as the electrode (ground side) of the aforementioned capacitor, and also provides an isolation action for preventing the generation of parasitic channels on the surface of the substrate immediately below it. However, studies carried out by these inventors have made it clear that with the aforementioned type of structure, as the degree of integration is increased, it becomes impossible to divide the source areas or the drain areas, and it is sometimes impossible to position the word line (35) itself as desired. This will be explained below with reference to the manufacturing procedures shown in FIGS. 32–39.

Specifically, as shown in FIG. 32, the nitride film (51) is deposited to the surface of the well (1) to be isolated from it by an $SiO_2$ film (50). After it is coated and exposed into a prescribed pattern, the nitride film (51) or resist is used as a mask in etching the substrate (1). Thus, a trench-shaped groove (20), having a depth in the range of 3–5 μm when used for a 64 megabite product, is formed on the substrate (1) in the memory cell unit.

Next, a commonly known method is used to diffusion-form an n-type impurity (such as As) on the walls of the groove (20), thereby forming an $n^+$ diffusion area (34), which is used for storing the capacitor electrode. Next, CVD (chemical vapor phase deposition method) or a thermal oxidation method is used to form $SiO_2$ film (25) on the walls of the groove (20) to a thickness of approximately 100 Å.

Next, as shown in FIG. 33, the CVD method is used to deposit an n-type polysilicon (43) over the entire surface, including the groove (20), thereby forming a photoresist (93) in the prescribed pattern on only the prescribed areas (capacitor area).

Next, as shown in FIG. 34, the resist (93) is used as a mask in wet etching and then the polysilicon (43) is etched by dry etching. During this procedure, parts of all of the films below are etched. An area (90), in which the polysilicon (43) is not present, becomes the transistor formation area.

Next, as shown in FIG. 35, the surface of the polysilicon layer (43) is oxidized by a thermal oxidation technology, thereby growing an $SiO_2$ layer (52). During this process, since the $SiO_2$ layer (52) is grown such that after growth it will protrude somewhat into the periphery, before the following procedure (before the polysilicon (35) is deposited), $Si_3N_4$ is deposited over the entire surface and etching back technology is used to adhere the $Si_3N_4$ film (57) shown in FIG. 31 around the $SiO_2$ layer (52).

Specifically, as shown in FIG. 36, CVD is used to deposit an $Si_3N_4$ film (57), then etching back is used to selectively adhere the $Si_3N_4$ film (57) to the circumstance of the $SiO_2$ layer (52), as shown in FIG. 31. Thus, when a hood structure (95), resulting from the protrusion of the aforementioned $SiO_2$ layer (52), is formed, and a polysilicon (35) used for gates is adhered as shown in FIG. 31, this polysilicon reaches even below the aforementioned hood structure and thus remains unetched during gate patterning, thereby making it possible to prevent short-circuits between adjoining word lines.

However, in actual practice, since the aforementioned hood structure (95) protrudes considerably in the horizontal direction as shown in FIG. 35, it may remain as shown in FIG. 37 even if etching back of nitride film is carried out, since the following nitride film (57) is deposited to completely bury the area (90) as shown in FIG. 36.

In this case, it is not possible to form the area (90), serving as a transistor, according to the design (in particular, it is not possible to remove the nitride (51) by etching). Thus, it is impossible to form the following gate oxide film (17) and form the polysilicon gate (35), while it is impossible to form the transistor.

In relation to this issue, a particular problem is the fact that the oxidation shown in FIG. 35 causes the top of the polysilicon (43) to expand in volume, thus expanding outward horizontally. This becomes a more serious problem as the degree of integration is increased to reduce transistor size.

In addition, another problem occurs during the formation of the field plate (43), which is adjacent to adjoining capacitors as Shown in FIG. 38, which shows a cross section different from that in FIG. 31, wherein if the patterning mask (93) of the polysilicon layer (43) shifts in position, as shown by the dotted and dashed line, from the proper position in the alternate long and short dash line, then the polysilicon (43) following the etching procedure will be thinner in the graded area (43b), as shown by the alternate long and short dash line.

Due to this phenomenon, and due to the fact that the diameter of the groove (20) is reduced as the cell size is reduced, precision in the polysilicon patterning becomes more difficult to obtain, thus further increasing the likelihood of the phenomenon. In addition, in the worst cases, the polysilicon (43) may cause line cutting, and even if this does not occur, the polysilicon (43b), which is allowed to remain in the following oxidation procedure (FIG. 39) as shown by the imaginary line, becomes completely oxidized, thus forming $SiO_2$ (52).

As a result, there is the risk that even the field plate (43)

will cease to function, which is another serious problem along with the aforementioned problems.

OBJECT OF THE INVENTION

An object of the present invention is to offer a semiconductor device and manufacturing method for with which it is possible to form the desired areas according to designs and which is effective in preventing line cutting, etc., and flattening the surface.

Specifically, the present invention relates to a semiconductor device that is characterized by containing the following:

- a first depression, which is formed on the surface of a semiconductor substrate;
- a second depression, which is formed to be continuous with the first depression and to be deeper than the first depression;
- a conductor, which is buried in the first and second depressions;
- and an insulating film, which is formed on top of the conductor;
- wherein the interface between the insulating film and the conductor is formed inside the first depression.

In addition, the present invention also offers:

a method for manufacturing a semiconductor device comprising the steps of:
- forming a first depression on the surface of a semiconductor substrate;
- forming a second depression to be linked with the first depression and to be deeper than the first depression;
- burying a conductor in the first and second depressions to a level which is lower than the outermost surface of the semiconductor substrate surface;
- forming an insulating film on top of the conductor.

Figure 1:
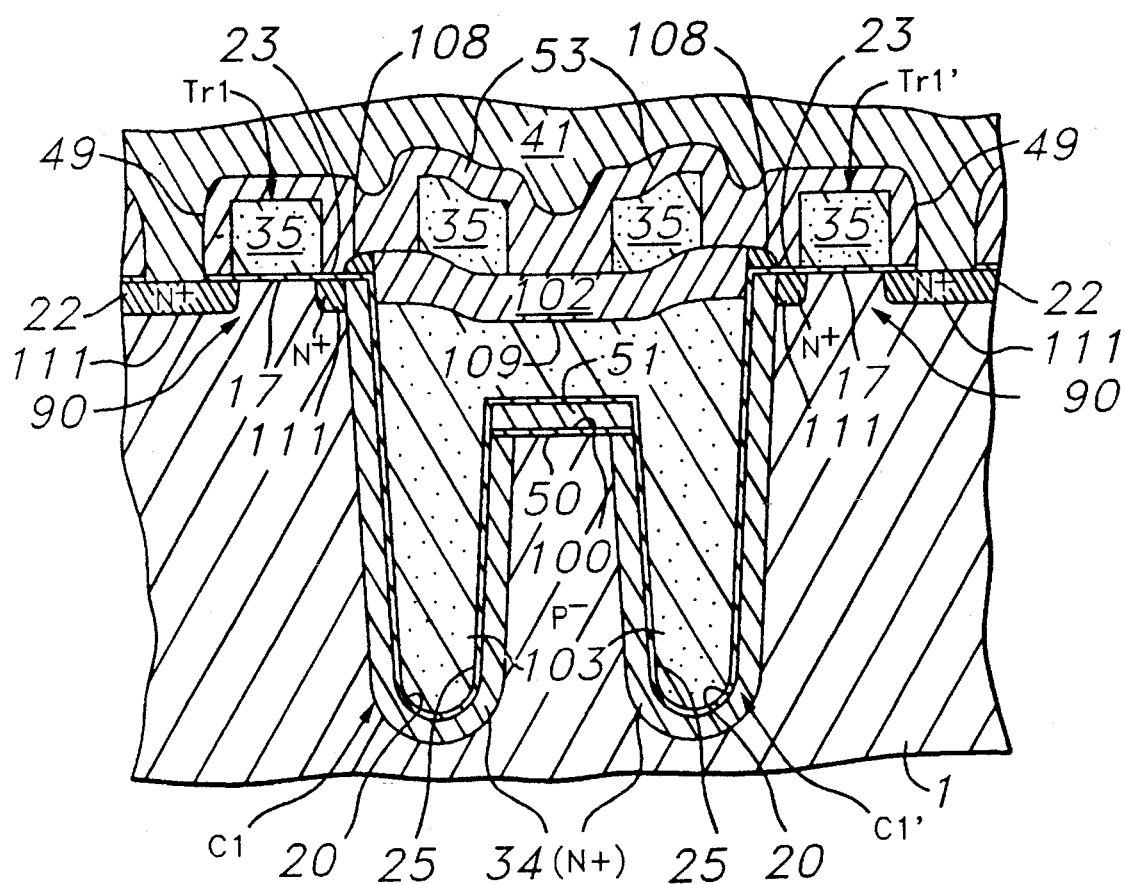
FIG. 1 is a cross section of the major parts of memory cells in the dynamic RAM of the first embodiment of the present invention (cross section of the line A—A in FIG. 4).

In reference numerals as shown in the drawings:
1. Substrate (p$^-$-type well)
17. Gate oxide film
20. Trench-shaped groove
22, 23, 33, 34. n$^+$-type diffusion areas
25, 50. SiO$_2$ films
35. Polysilicon gate electrode (word line)
41. Bit line
51. Nitride film
90. Gate active area
100. Depression
100a. Surrounding wall
102. SiO$_2$ layer
103. Polysilicon field plate
108. Si$_3$N$_4$ layer (side wall)
110. Depletion layer
111. pn junction
Tr$_1$, Tr'. Transfer gates
C$_1$, C$_1$'. Capacitors
W. Channel width

DESCRIPTION OF THE PREFERRED EMBODIMENTS

FIGS. 1–4 show a dynamic RAM (such as a 64 megabyte RAM) produced in the first embodiment of the present invention.

Figure 2:
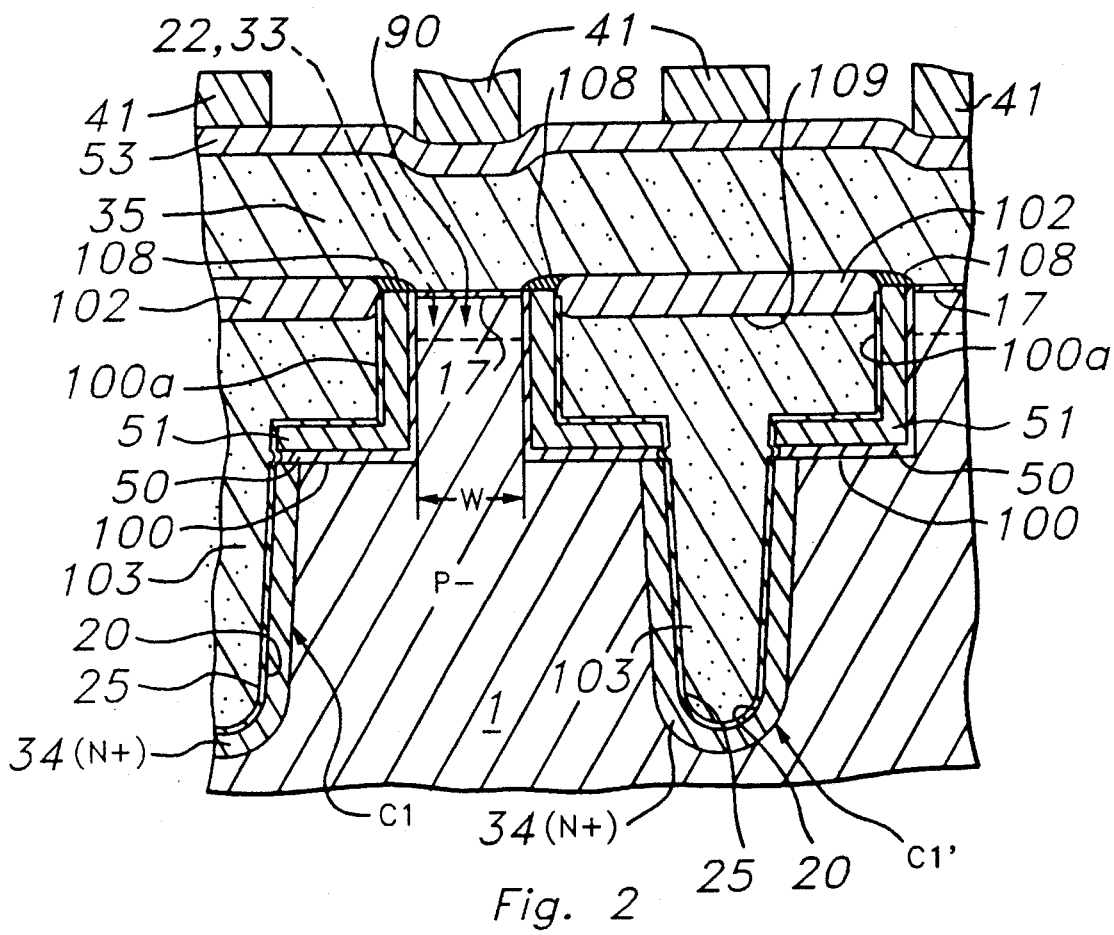
FIG. 2 is another cross section of the same memory cell unit (cross section of the line B—B in FIG. 4).
Figure 3:
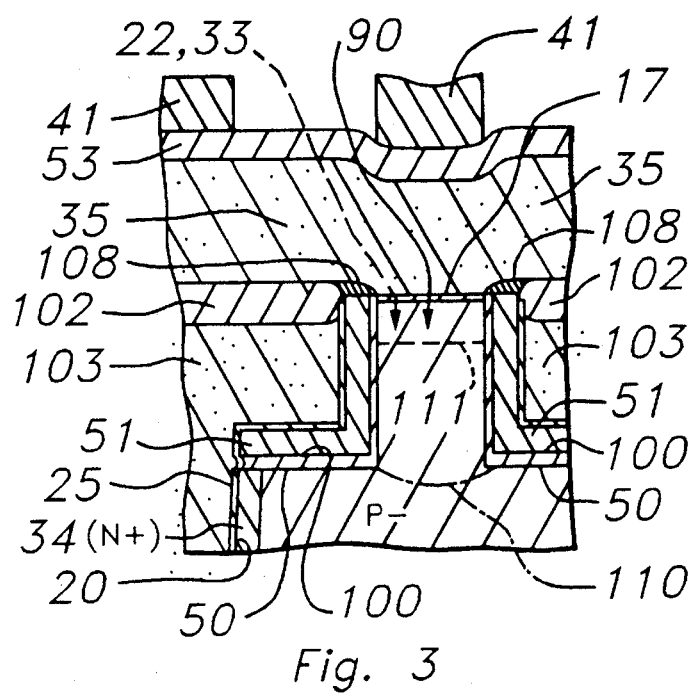
FIG. 3 is a cross section which shows part of FIG. 2.
Figure 4:
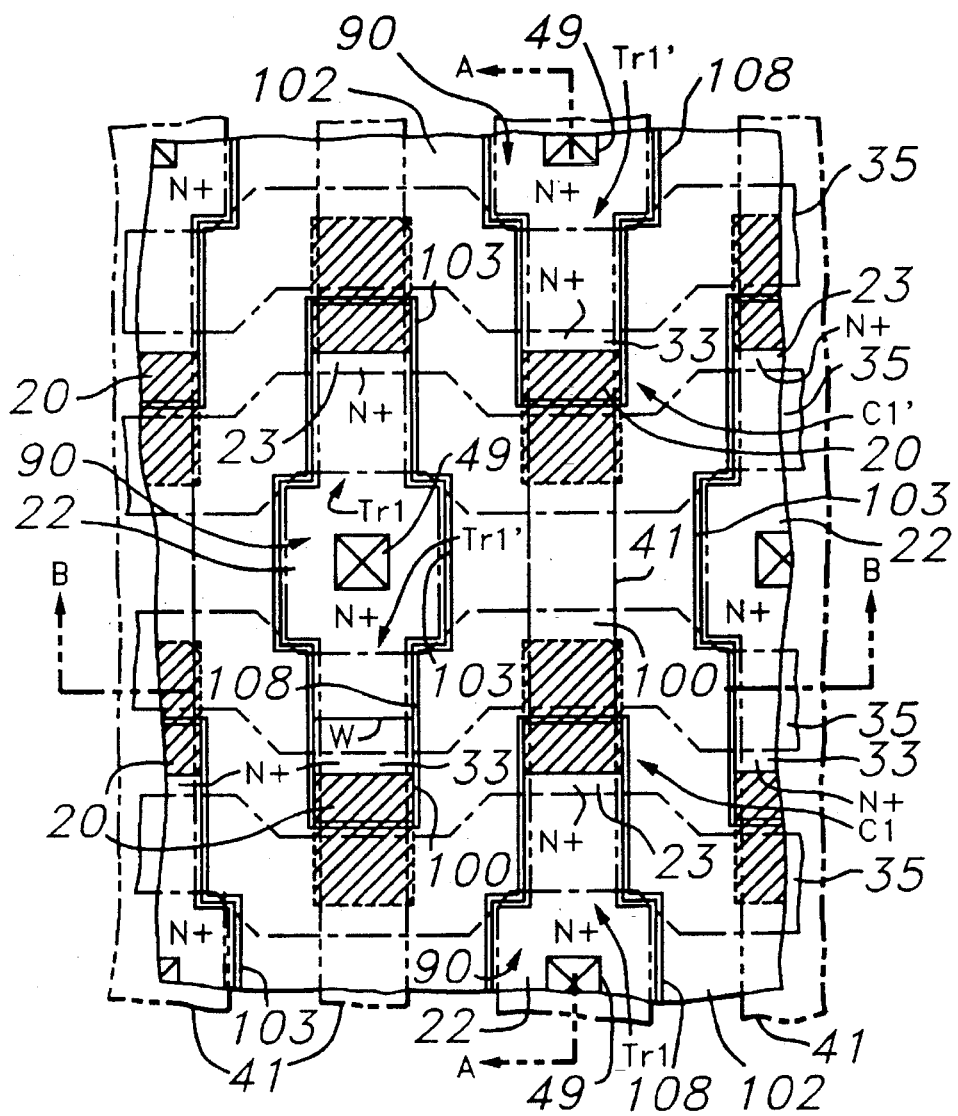
FIG. 4 is a plan view of the same memory cell unit.

FIG. 1 is a cross section which shows adjoining memory cells (cross section of the line A—A in FIG. 4). FIG. 2 is a cross section along the word line (cross section of the line B—B in FIG. 4). FIG. 3 shows part of FIG. 2.

With the dynamic RAM of the present example, the memory cells comprise of a single transistor-single capacitor structure, comprising transfer gates Tr$_1$ and Tr$_1$', which are composed of n-channel insulation gate field effect transistors; and capacitors C$_1$ and C$_1$', which are connected to the source areas (23) and (33) of these transfer gates. The capacitors C$_1$ and C$_1$' are connected in common for adjoining cells (see FIG. 1).

Next, a trench-shaped groove (20) (shown by the diagonal lines in FIG. 4) of a prescribed depth is formed on one side of a p$^{--}$-type silicon substrate (specifically, a p$^-$-type well (1) formed on a silicon substrate). This groove (20) is covered with an insulating film (25) and then filled with an n$^+$-type polysilicon (field plate) (103).

In this case, the area next to the top of the groove (20) (especially the area away from the memory cell active area (90)) is removed to form a depression (100) which is continuous with the groove (20) (or to the contrary, the groove (20) is formed to be continuous with the depression (100)). The polysilicon field plate (103) is then buried in this depression (100) and groove (20) (which is a depression that is much deeper than the depression (100)). Thus, the field plate (103) is present in a position below the surface of the memory cell active area (90). In addition, a polysilicon oxide (102) has a thickness of approximately 2500 Å, and protrudes upward slightly from the aforementioned surface.

A film (108), having nitride as the main component, is applied to the oxide (102) by a side wall technology. It has the same functions as (57) described above. As will be explained below, this nitride film (108) is designed such that the memory cell active area (90) can be properly divided according to designs.

Next, the n$^+$ diffusion area (34), which is diffusion-formed on the entire outside of the groove (20), is used in forming the capacitors C$_1$ and C$_1$'. In addition, n$^+$-type source areas (23) and (33), which are linked to the n$^+$-type diffusion area (34), and an n$^+$-type drain area (22), which is connected to a bit line (41) (such as a polysilicon layer), are diffusion-formed on the other surface of the groove (20). Gate electrodes (35), which serve as word lines, are situated in between these areas via a gate oxide film (17), thereby connecting the n-channel insulation gate field effect transistors (transfer gates) Tr$_1$ and Tr$_1$', which are used in horizontal transmission.

Two transfer gates (Tr$_1$, Tr$_1$') are installed in one cell area in the memory cell array unit as shown in FIG. 4. A bit line (41) is installed to be common to both of these.

The capacitors C$_1$-C$_1$' are connected to each other between cells by a field plate (103). The bottom of this field plate is insulated and isolated by an SiO$_2$ film (50) and Si$_3$N$_4$ film (51). In addition, its top is insulated and isolated by an SiO$_2$ film (102).

The word lines (35) of the other transfer gate are situated on top of the SiO$_2$ film (102). The SiO$_2$ (102) is deposited to an Si$_3$N$_4$ film (108) on the cell array unit side.

In addition, an SiO$_2$ layer (53) is deposited on top of the word lines (35), serving as an interlayer insulating film which isolates the bit line (41) and word lines (35) from each other. The bit line (41) and n$^+$-type region (22) are connected to each other via contact hole (49).

With the memory cell unit thus constructed, the depression (100) is formed to be continuous with the trench-shaped groove (20). The polysilicon layer (103), which serves as a field plate, is buried in this depression (100) and groove (20), and an SiO$_2$ layer (102) is then formed on top of it. Thus, when the polysilicon layer (103) is subjected to an oxidation treatment during the formation of the SiO$_2$ layer (102), the surrounding wall (100a) of the depression (100) (see FIG. 2) prevents the SiO$_2$ layer (102) from growing horizontally. Thus, the interface (109) between the SiO$_2$ layer (102) and polysilicon layer (103) is formed inside the depression (100).

As a result, since it is possible to form an Si$_3$N$_4$ layer (107) by a side wall technology in the following procedure, it is possible to secure the transfer gate active area (90) according to designs. Thus, this active area (90) is already secured during the formation of the aforementioned depression (100), thereby making it possible to carry out the procedures with precision and according to designs.

In addition, since the polysilicon layer (103) is buried at a level lower than the upper surface of the gate active area (90), even when the $SiO_2$ layer (102) is grown by oxidation, the polysilicon layer (103) will be connected between the cells over a sufficient cross section area, as shown in FIG. 1. Thus, there will be no wire cutting in the polysilicon layer (103). During this process, it is easy to bury the polysilicon layer (103) at the prescribed level before growing the oxide layer (102) using an etching back technology to be described below. Since it is not necessary to use a mask in performing etching, as prior art, it is possible to allow the polysilicon layer (103) to remain between the two cells over a sufficiently large cross section area at all times.

In addition, since there is not a large difference in level between the upper surface of the $SiO_2$ layer (102) and the gate active area (90), the surface is flatter than in the conventional structure (see FIG. 31) and it is easier to form wiring, etc. Thus, it is possible to prevent the problems of cutting wires.

Figure 31:
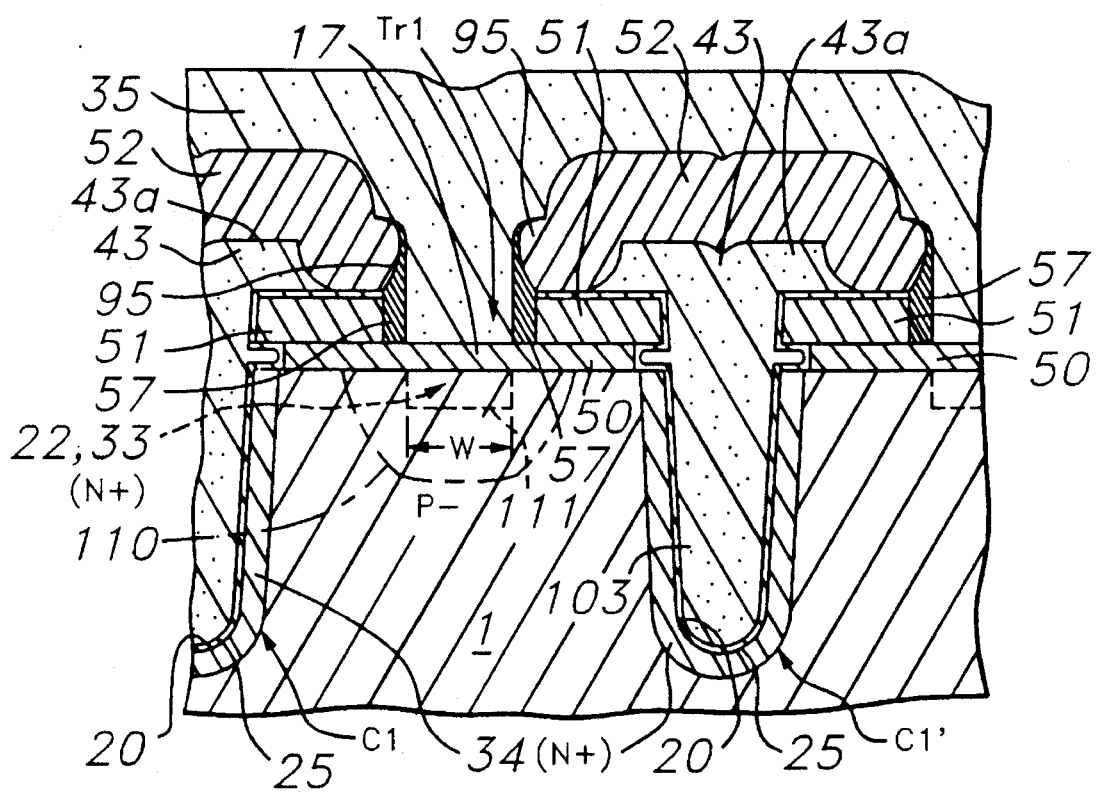
FIG. 31 is a cross section of the major parts of memory cells in the dynamic RAM of a conventional example.
Figure 32:
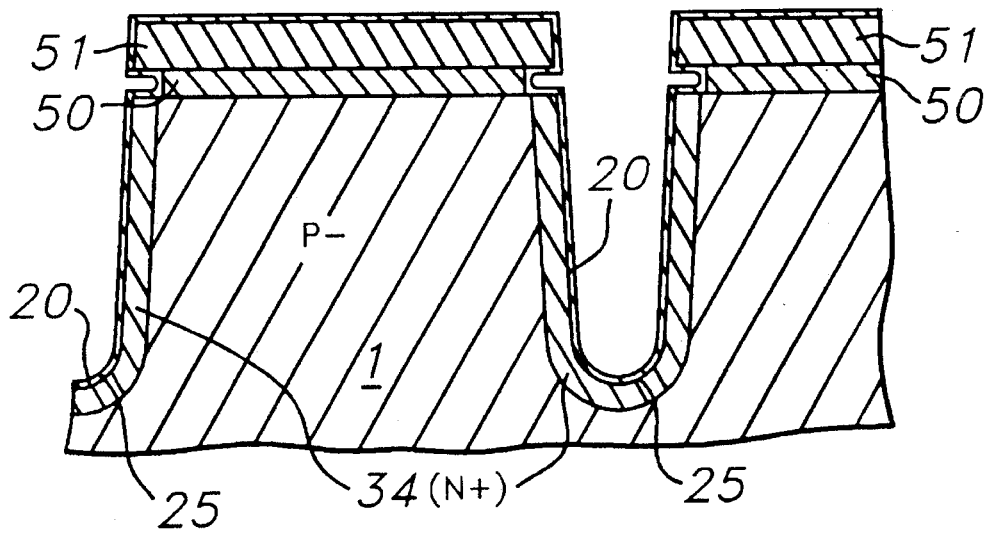
FIG. 32 is a cross section which shows a step in the method for manufacturing the aforementioned RAM in relation to the memory cells.
Figure 33:
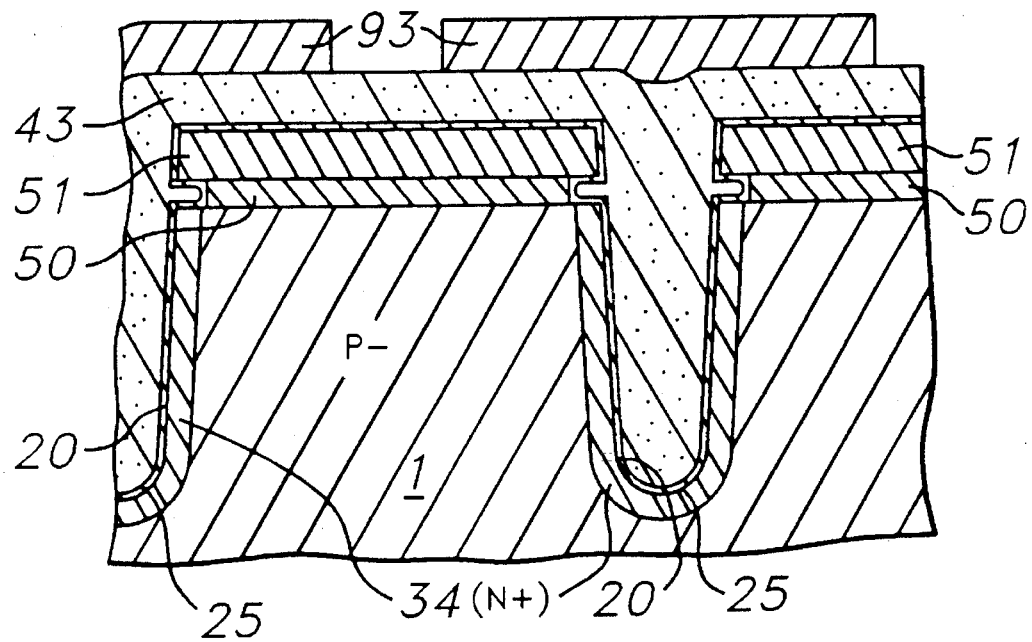
FIG. 33 is a cross section which shows a step in the method for manufacturing the aforementioned RAM in relation to the memory cells.
Figure 34:
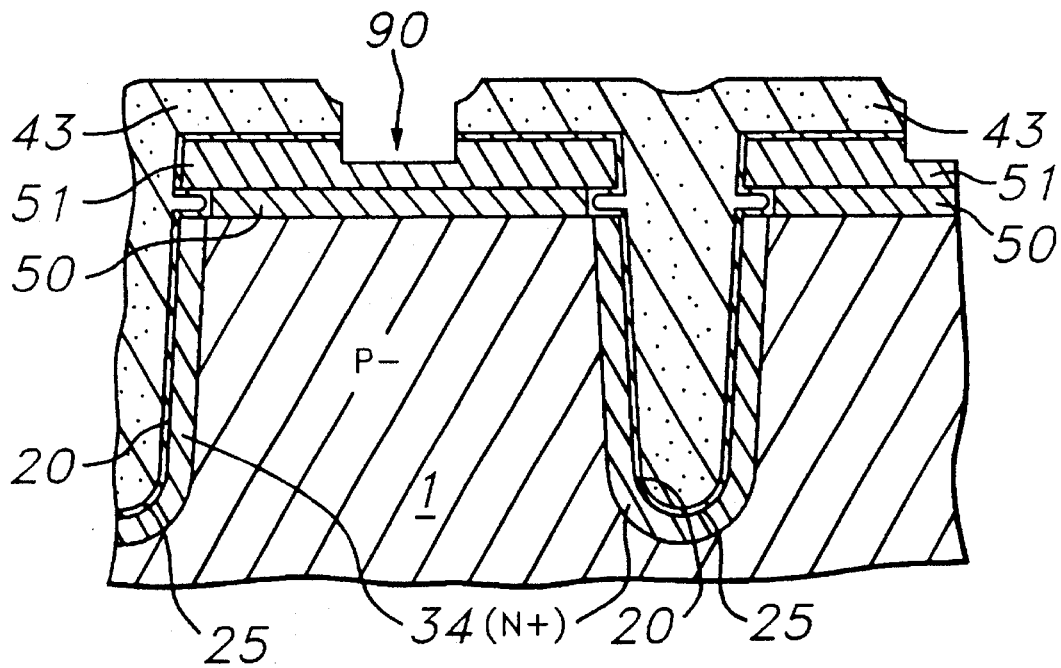
FIG. 34 is a cross section which shows a step in the method for manufacturing the aforementioned RAM in relation to the memory cells.
Figure 35:
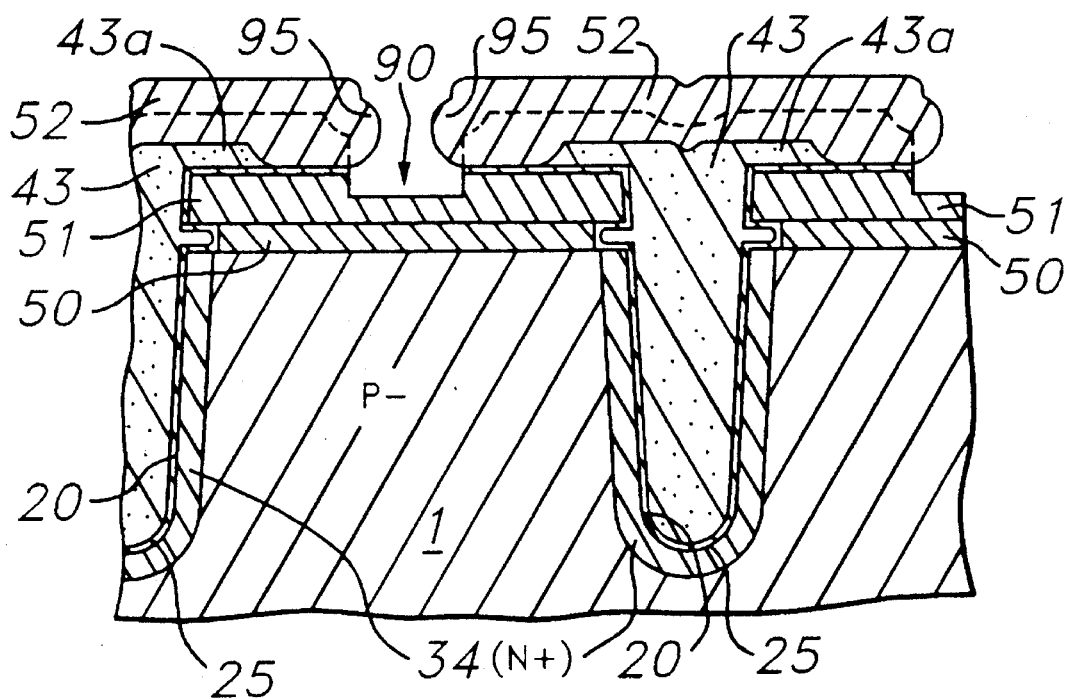
FIG. 35 is a cross section which shows a step in the method for manufacturing the aforementioned RAM in relation to the memory cells.
Figure 36:
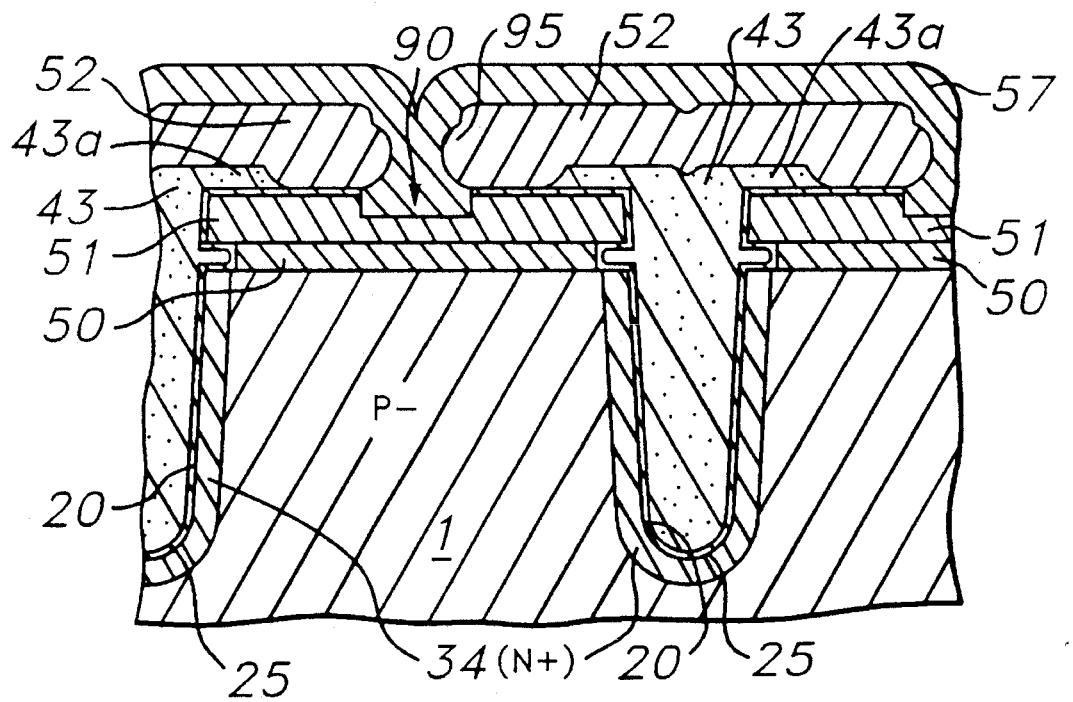
FIG. 36 is a cross section which shows a step in the method for manufacturing the aforementioned RAM in relation to the memory cells.
Figure 37:
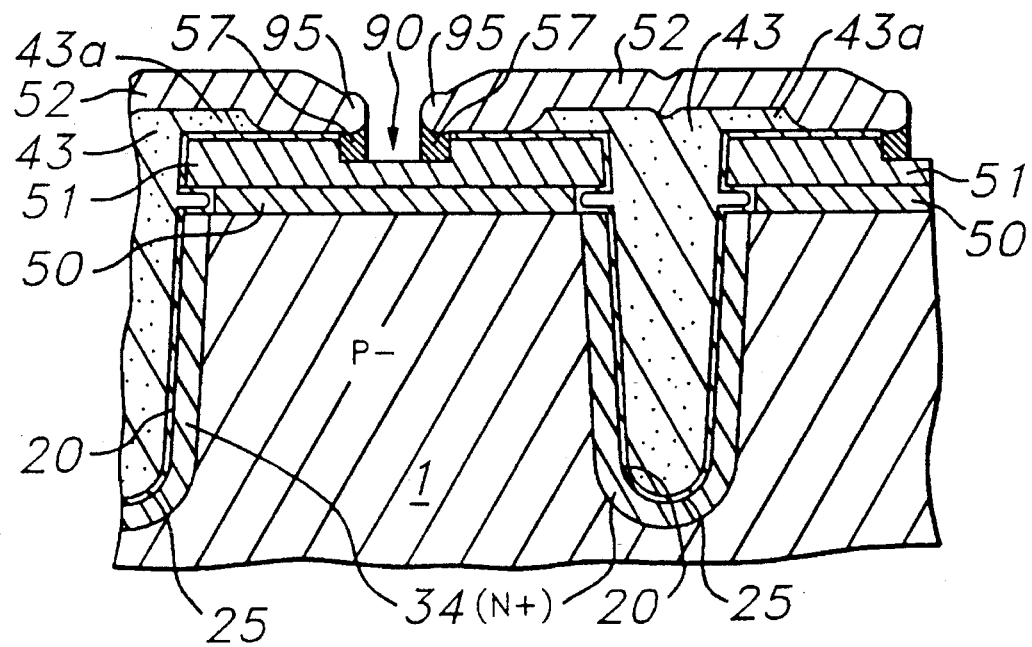
FIG. 37 is a cross section which shows a step an the method for manufacturing the aforementioned RAM in relation to the memory cells.
Figure 38:
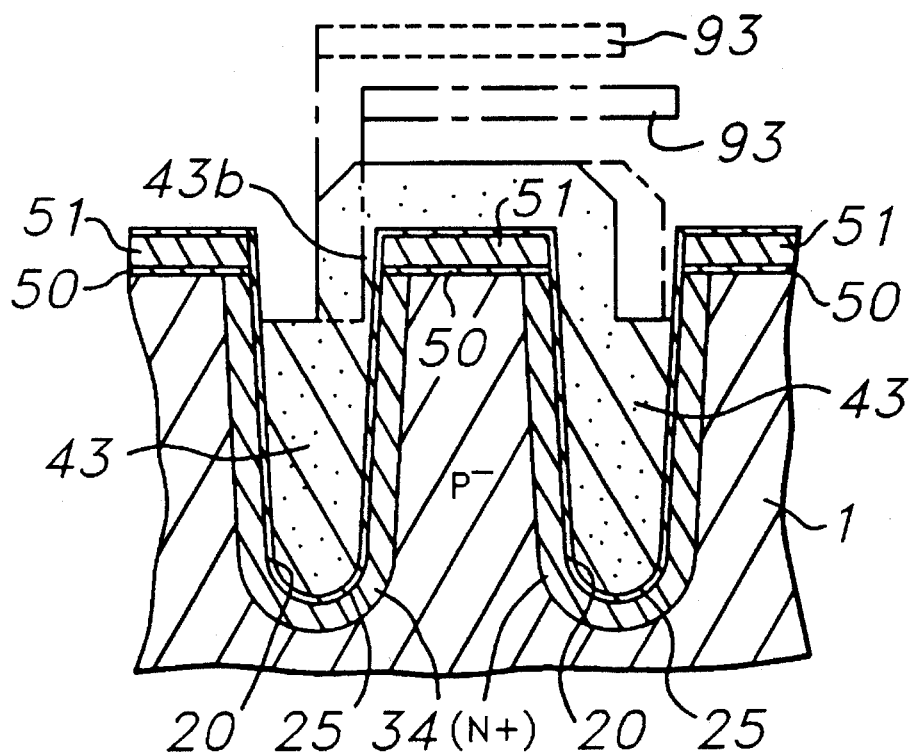
FIG. 38 is a cross section which shows a step in the method for manufacturing the aforementioned RAM in relation to the memory cells.
Figure 39:
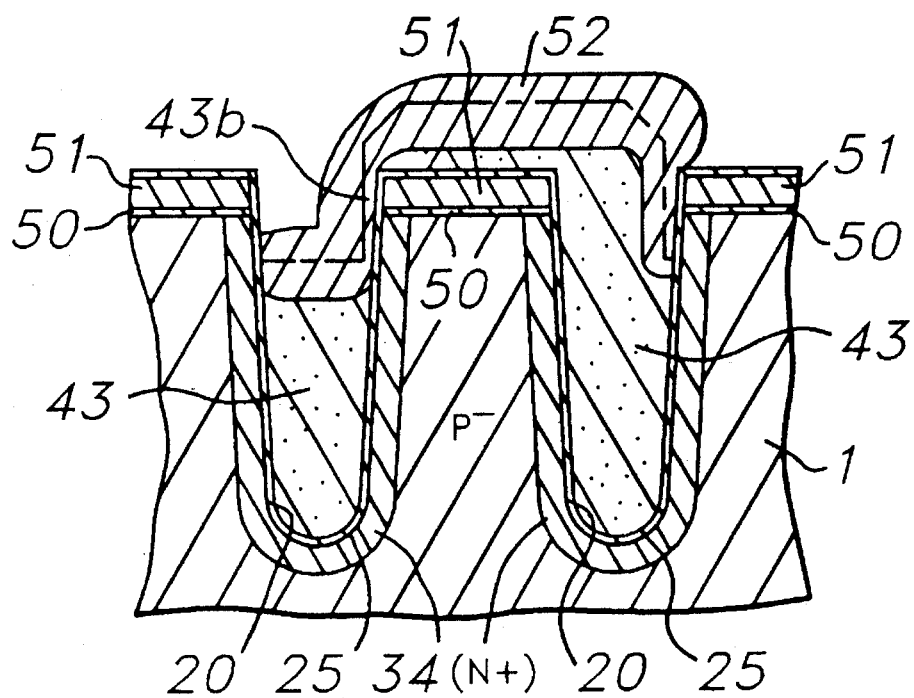
FIG. 39 is a cross section which shows a step in the method for manufacturing the aforementioned RAM in relation to the memory cells.

In addition, as shown in FIGS. 2 and 4, since the gate width W is determined according to designs, it is difficult for the so-called narrow channel effect to occur. Specifically, with the conventional structure as shown in FIG. 31, a pn junction (111), formed by the $n^+$-type diffusion areas (22) and (33) and the well (1), is also present in the side areas. Thus, when the gate width W is reduced by the increased degree of integration, the depletion layer (110) increases the rate of expansion like a fictitious line when voltage is applied to the gate (35). Thus, it becomes difficult to apply gate voltage in the channel areas, which increases the threshold voltage. In contrast, with the structure of the present example as shown in FIG. 3, the gate width is limited to the space of the aforementioned depression (100) (thus making it possible to set the gate width according to plans, allowing the $n^+$-type areas (22) and (33) to be divided within the same width, so that the pn junction (111) does not exist on the sides). Thus, it seems that the depletion layer (110) will only expand in a limited area, making it possible to reduce the threshold voltage below that of the conventional technology.

In order to obtain the above effects, the depth of the aforementioned depression (100) (specifically, the distance between the surface of the gate active area and the nitride film (51)) should be set to 3000–6000 Å. In addition, the depth of the groove (20) is set to 3–5 μm.

In order to obtain the aforementioned effects, the depth of the depression (100) should be set to 3000 Å or greater. If it is less, then the depression (or level difference) starting at the surface of the gate active layer will be too small, thereby weakening the aforementioned effects. In addition, the polysilicon (103) located above the depression will be thin, which tends to increase the resistance of the field plate (103) between the cells (see FIG. 1).

On the other hand, when the depression (100) is deep, the aforementioned effects are easily obtained, and during the formation of the polysilicon layer (103), it will be easy for the polysilicon to grow evenly from the bottom and sides of the depression, thereby making it possible to form a polysilicon layer (103) with a flat upper surface, which was confirmed by simulation. Thus, the depth of the depression (100) should be set to 3000 Å or greater, but it is not necessary to make it too deep; it is practical to set is to less than 1 μm.

Next, the method for manufacturing the device of the present example will be explained with reference to FIGS. 5–24. FIGS. 5–14 correspond to FIG. 1, and FIGS. 15–24 correspond to FIG. 2.

Figure 5:
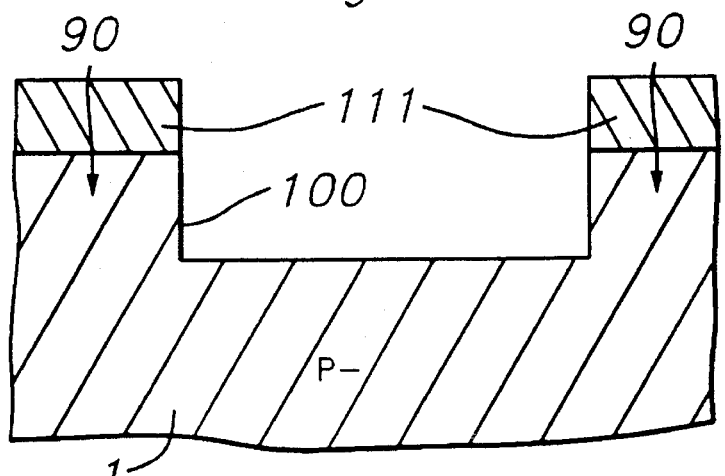
FIG. 5 is a cross section which shows a step in the method for manufacturing the aforementioned RAM in relation to the memory cells.
Figure 15:
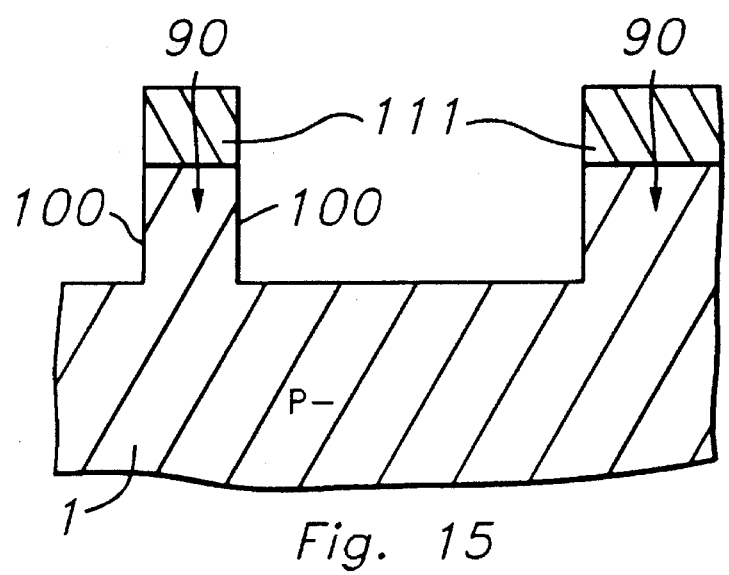
FIG. 15 is a cross section which shows a step in the method for manufacturing the aforementioned RAM in relation to the memory cells.

In the initial step of the procedures, as shown in FIGS. 5 and 15, p-type impurities (such as B) are ion-injected in the memory cell array unit to form a $p^-$-type well (1) on one surface of the $p^{--}$-type substrate.

Next, the gate active area (90) is covered with the photoresist (111), which has been given a prescribed pattern, and dry etching is carried out by RIE (reactive ion etching) to form the depression (100) over the field gate formation area to a depth of 3000–6000 Å.

Figure 6:
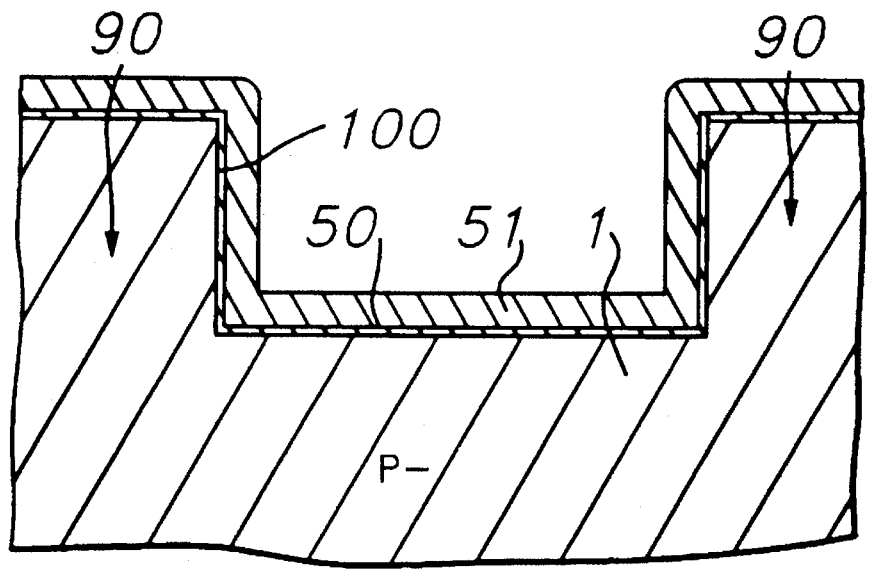
FIG. 6 is a cross section which shows a step in the method for manufacturing the aforementioned RAM in relation to the memory cells.
Figure 16:
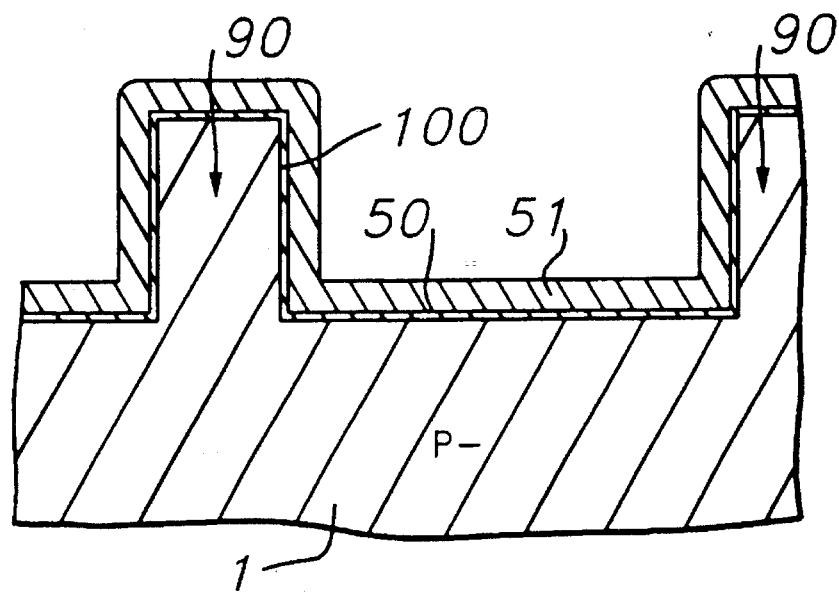
FIG. 16 is a cross section which shows a step in the method for manufacturing the aforementioned RAM in relation to the memory cells.

Next, as shown in FIGS. 6 and 16, the resist (111) is removed, after which a thin oxide film (50) is grown by thermal oxidation, and the $Si_3N_4$ film (51) is grown by CVD, on the surface, including the area of the depression (100).

Figure 7:
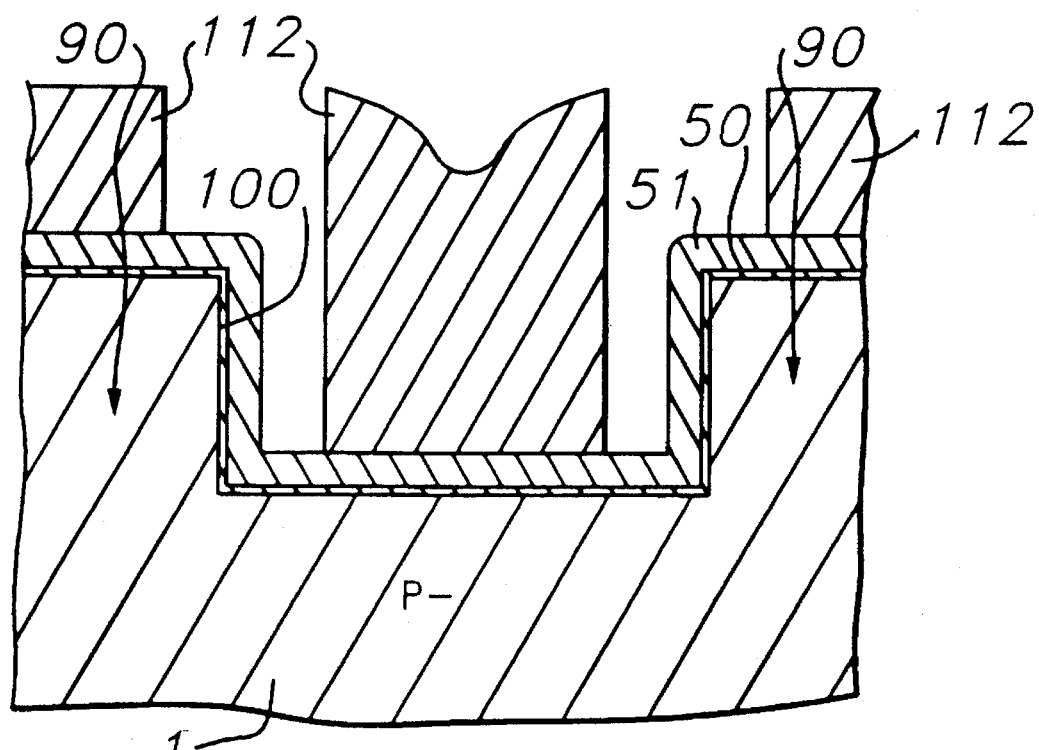
FIG. 7 is a cross section which shows a step in the method for manufacturing the aforementioned RAM in relation to the memory cells.
Figure 17:
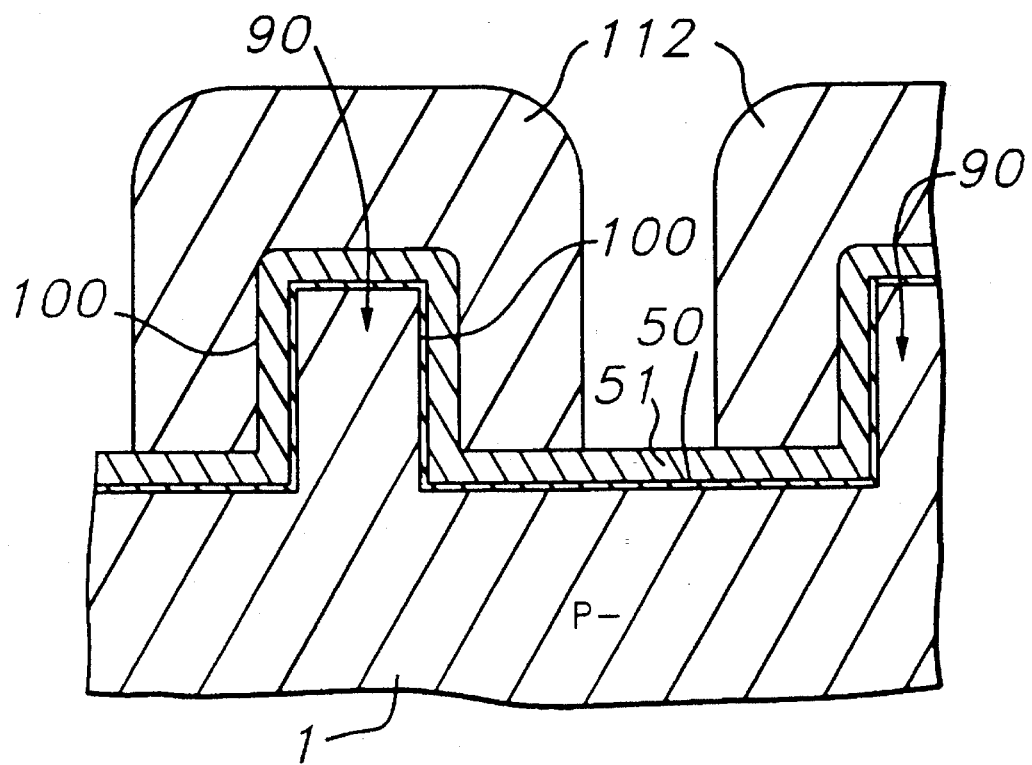
FIG. 17 is a cross section which shows a step an the method for manufacturing the aforementioned RAM in relation to the memory cells.

Next, as shown in FIG. 7 and 17, an $SiO_2$ layer (112) is deposited and patterned on the entire surface by CVD.

Figure 8:
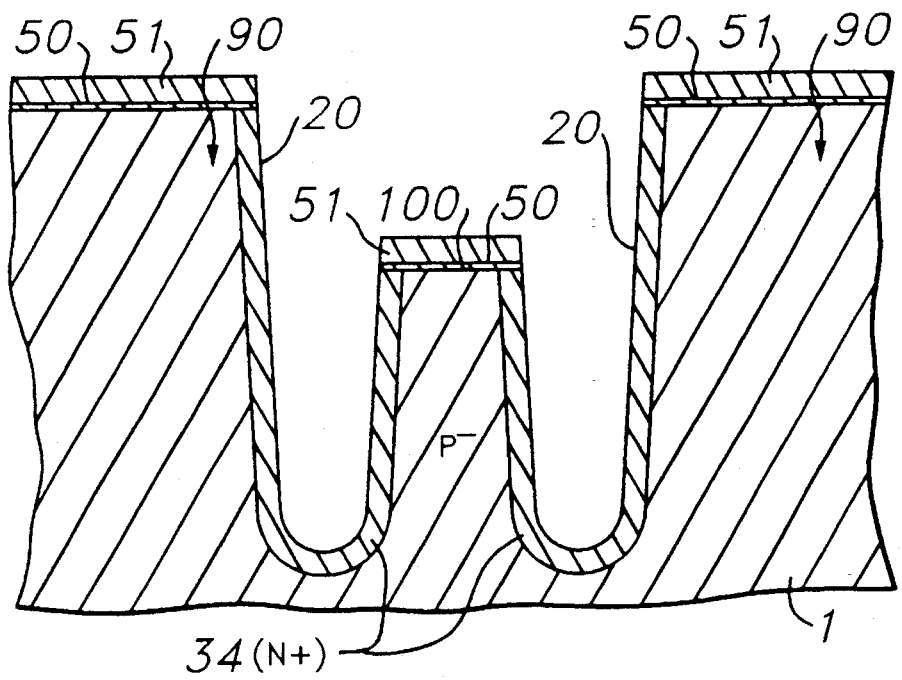
FIG. 8 is a cross section which shows a step in the method for manufacturing the aforementioned RAM in relation to the memory cells.
Figure 18:
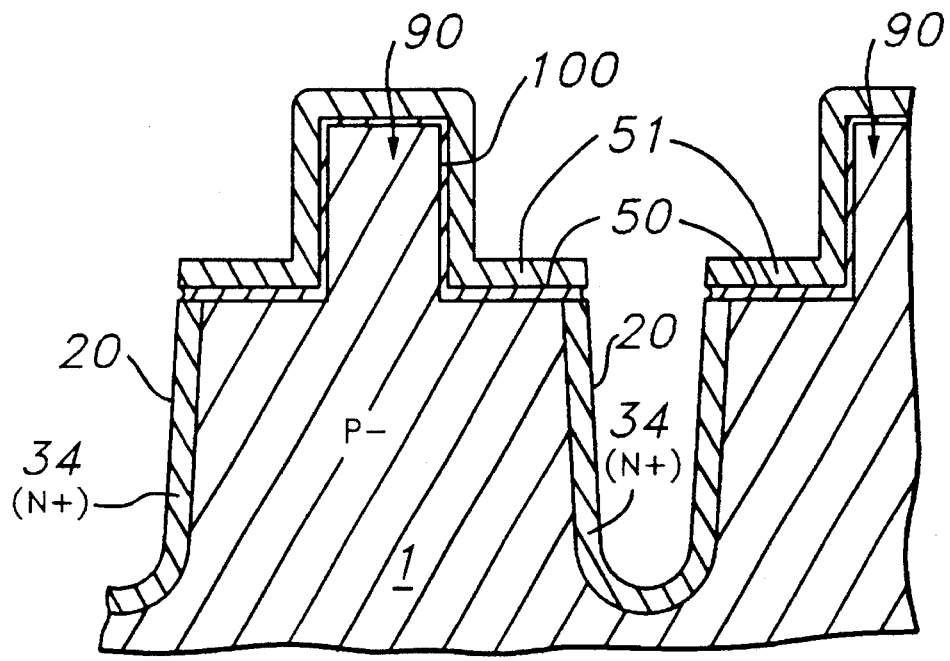
FIG. 18 is a cross section which shows a step in the method for manufacturing the aforementioned RAM in relation to the memory cells.

Next, as shown in FIGS. 8 and 18, the $SiO_2$ layer (112) is used as a mask in etching the $Si_3N_4$ film (51), $SiO_2$ film (50), and substrate (1), thereby forming a trench-shaped groove (20) to a depth of 3–5 μm on the substrate (1) in the memory cell unit. This groove (20) is formed such that part of it overlaps the aforementioned depression (100).

Next, a commonly known method is used to diffuse an n-type impurity (such as As) on the side walls of the groove (20), thereby forming an $n^+$ diffusion area (34), which is used to store the charge of the capacitors.

Figure 9:
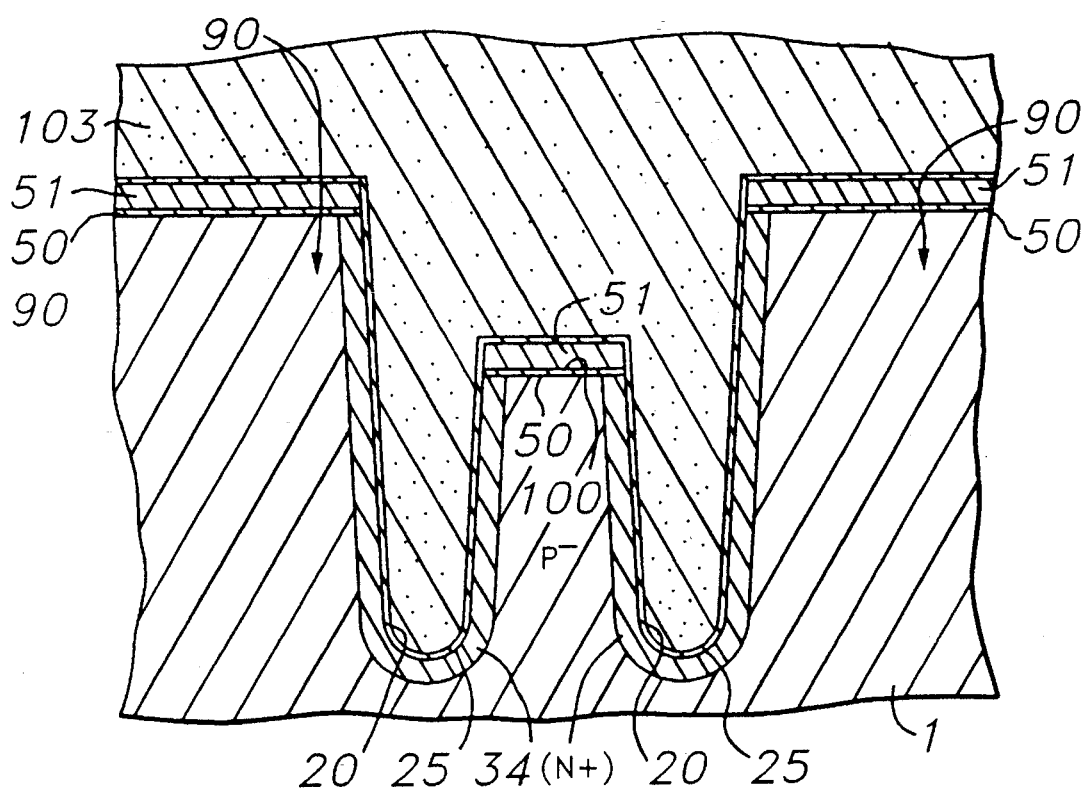
FIG. 9 is a cross section which shows a step in the method for manufacturing the aforementioned RAM in relation to the memory cells.
Figure 19:
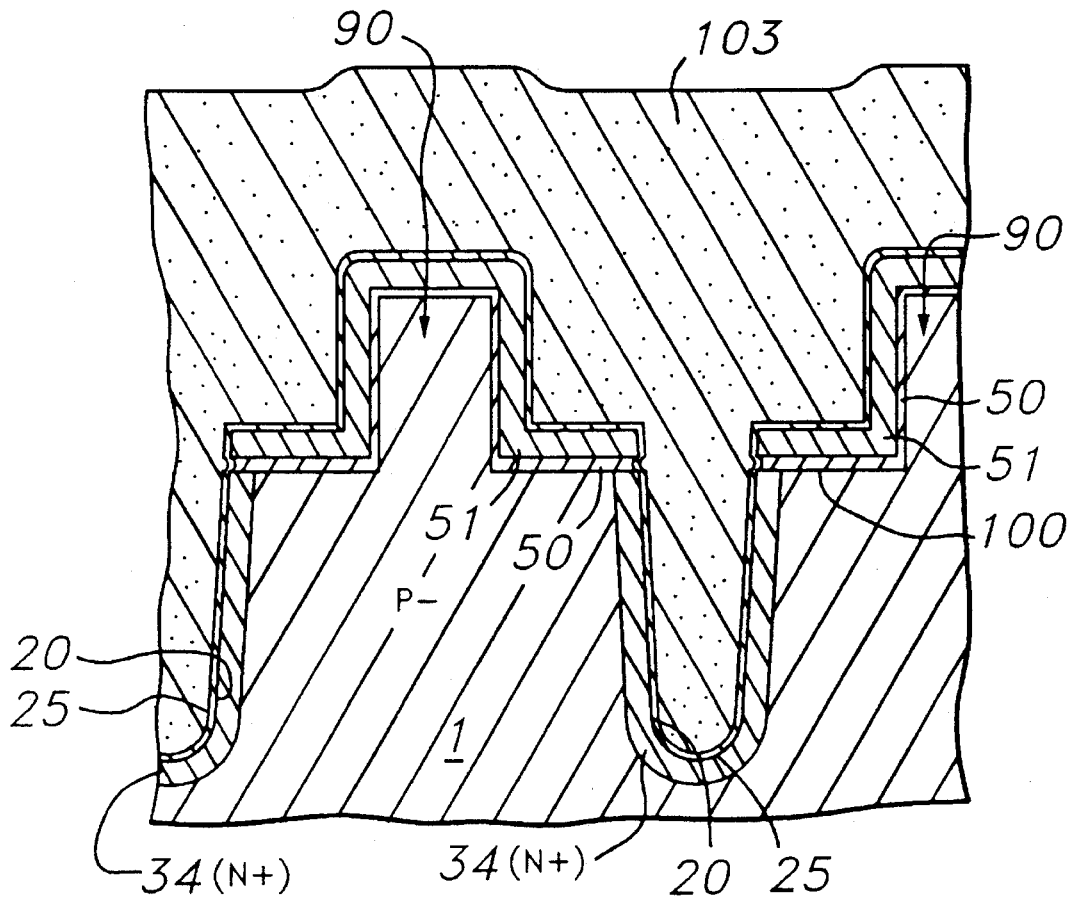
FIG. 19 is a cross section which shows a step in the method for manufacturing the aforementioned RAM in relation to the memory cells.

Next, as shown in FIGS. 9 and 19, CVD (chemical vapor deposition method) or a thermal oxidation method is used to form an $SiO_2$ film (25) with a thickness of approximately 100 Å on the walls of the groove (20).

Next, the CVD method is used to deposit an n-type polysilicon (103) over the entire surface, including the groove (20) and depression (100). During this process, the space between the gate active areas of the memory cell unit is reduced in order to increase the degree of integration, and the surface of the polysilicon layer (103) is nearly flat.

Figure 10:
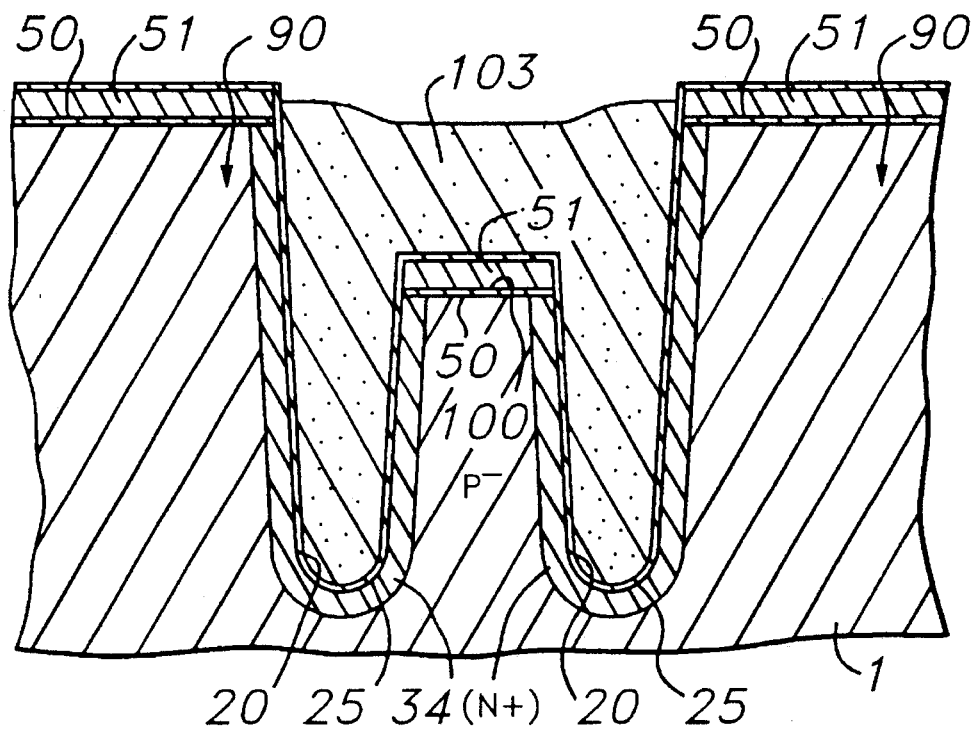
FIG. 10 is a cross section which shows a step in the method for manufacturing the aforementioned RAM in relation to the memory cells.
Figure 20:
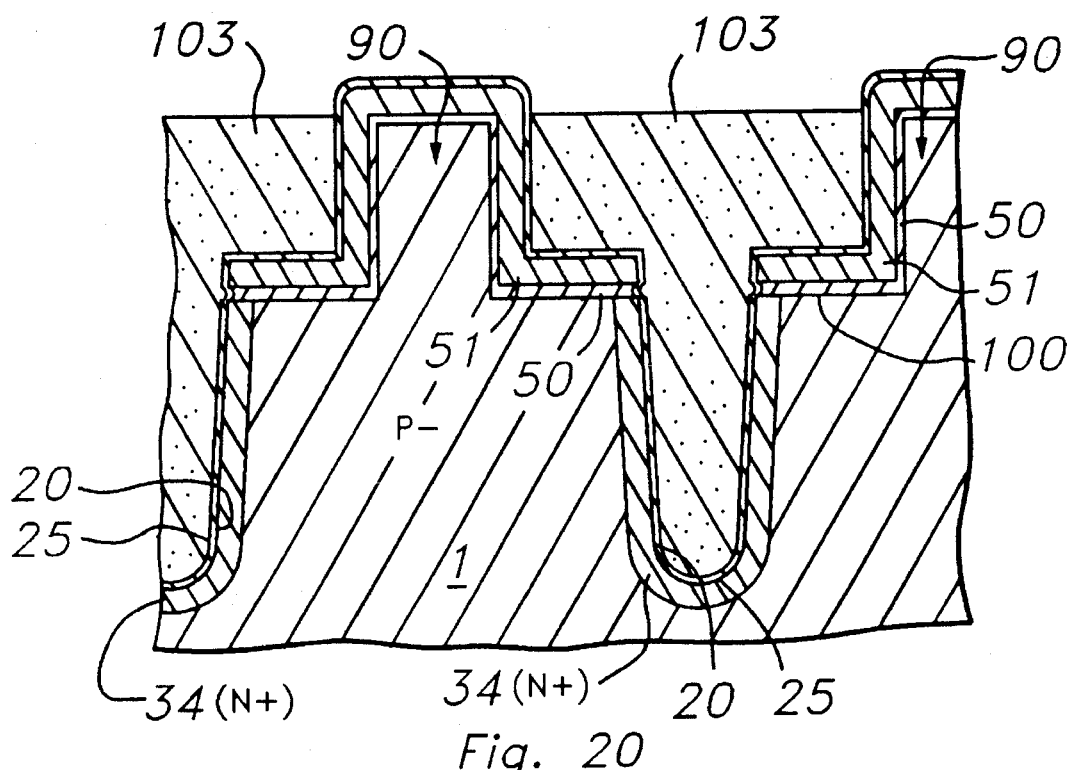
FIG. 20 is a cross section which shows a step in the method for manufacturing the aforementioned RAM in relation to the memory cells.

Next, as shown in FIGS. 10 and 20, etch back is carried out until the polysilicon on the gate active area disappears, and the polysilicon layer (103) is buried in an area away from the gate active area (90). The polysilicon layer (103) is buried at a level lower than the uppermost surface on the front side of the substrate (1) (i.e., the surface of (25) on the film (51)).

Figure 11:
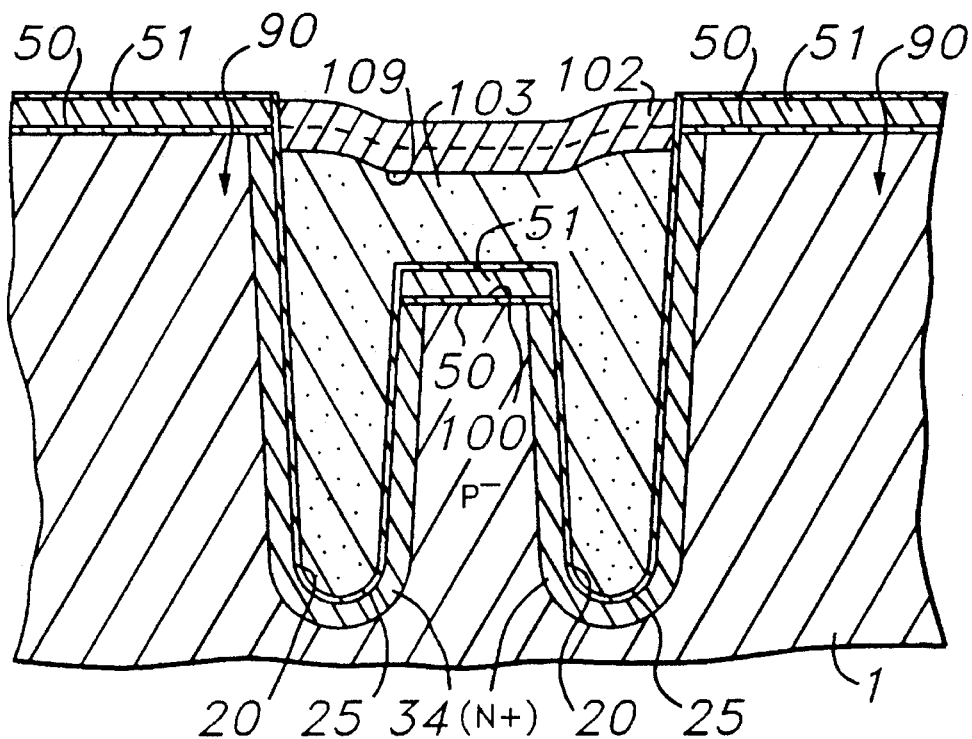
FIG. 11 is a cross section which shows a step in the method for manufacturing the aforementioned RAM in relation to the memory cells.
Figure 21:
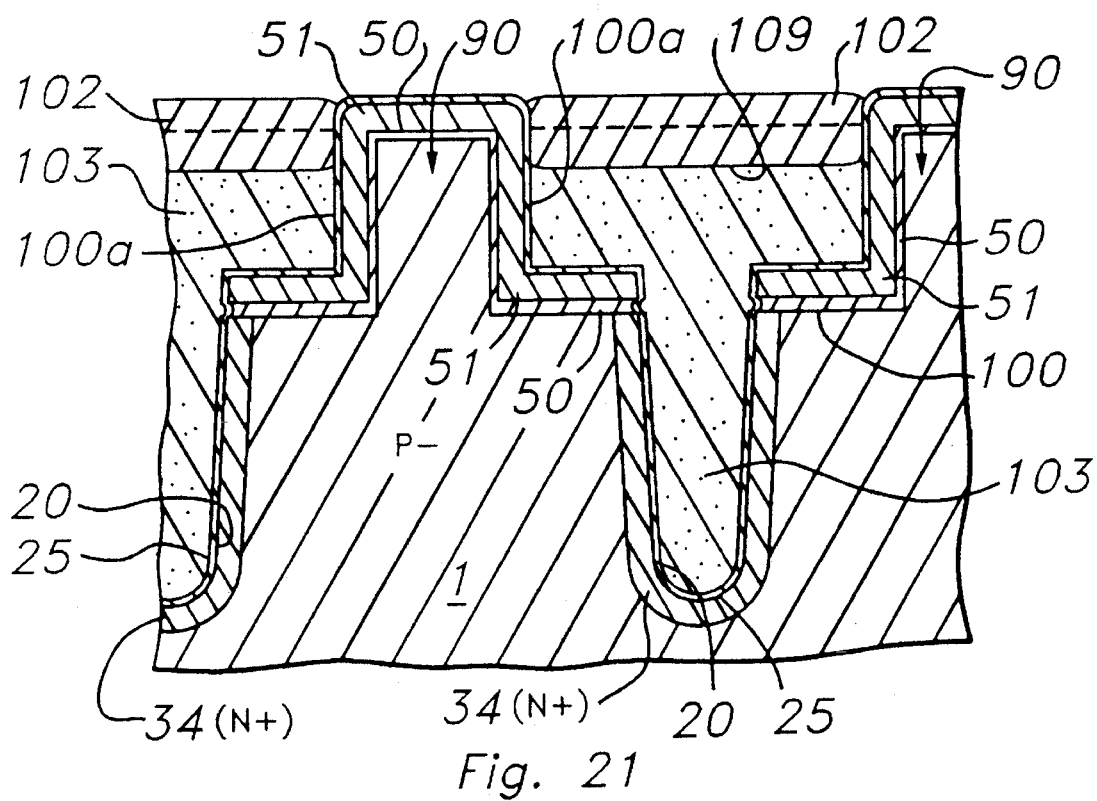
FIG. 21 is a cross section which shows a step in the method for manufacturing the aforementioned RAM in relation to the memory cells.

Next, as shown in FIGS. 11 and 21, the front surface (top) of the polysilicon layer (103) is given an oxidizing treatment, thereby growing the $SiO_2$ film (102). During this process, the upper surface of the polysilicon layer (103) is positioned below the gate active area (90) and oxidized as described above. Thus, the $SiO_2$ film (102) is restricted to the surrounding wall (100a) of the depression (100), and thus grows only upward without projecting horizontally. Thus, it is possible to form the field plate (103) in the desired position, and it is possible to secure the gate active area (90).

Figure 12:
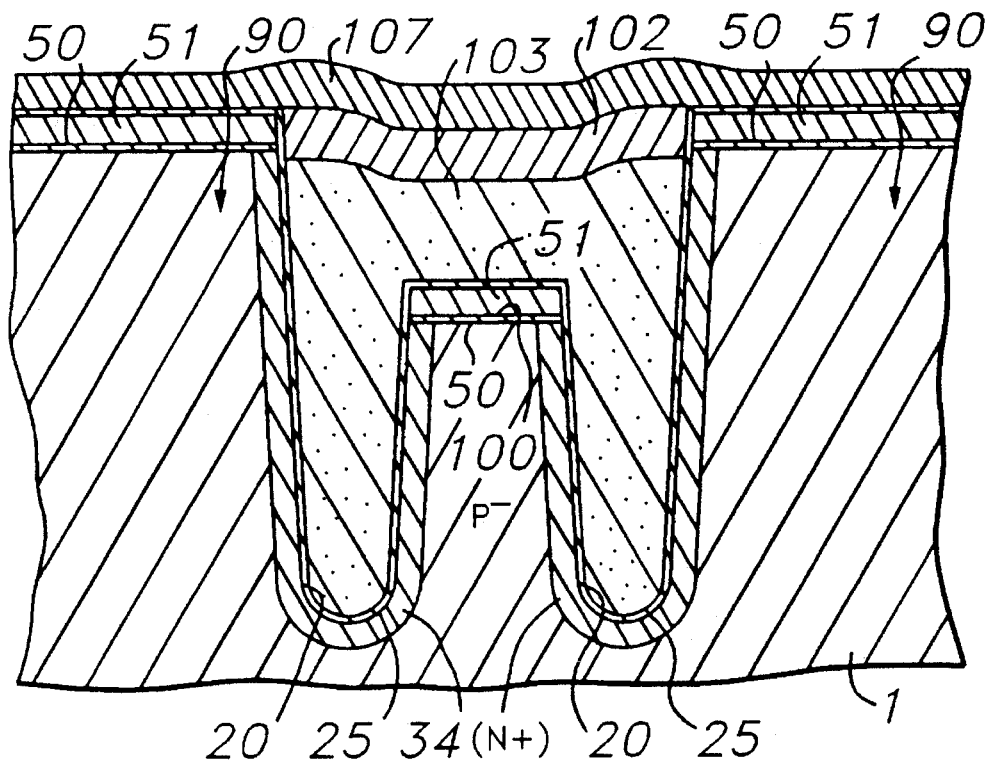
FIG. 12 is a cross section which shows a step in the method for manufacturing the aforementioned RAM in relation to the memory cells.
Figure 22:
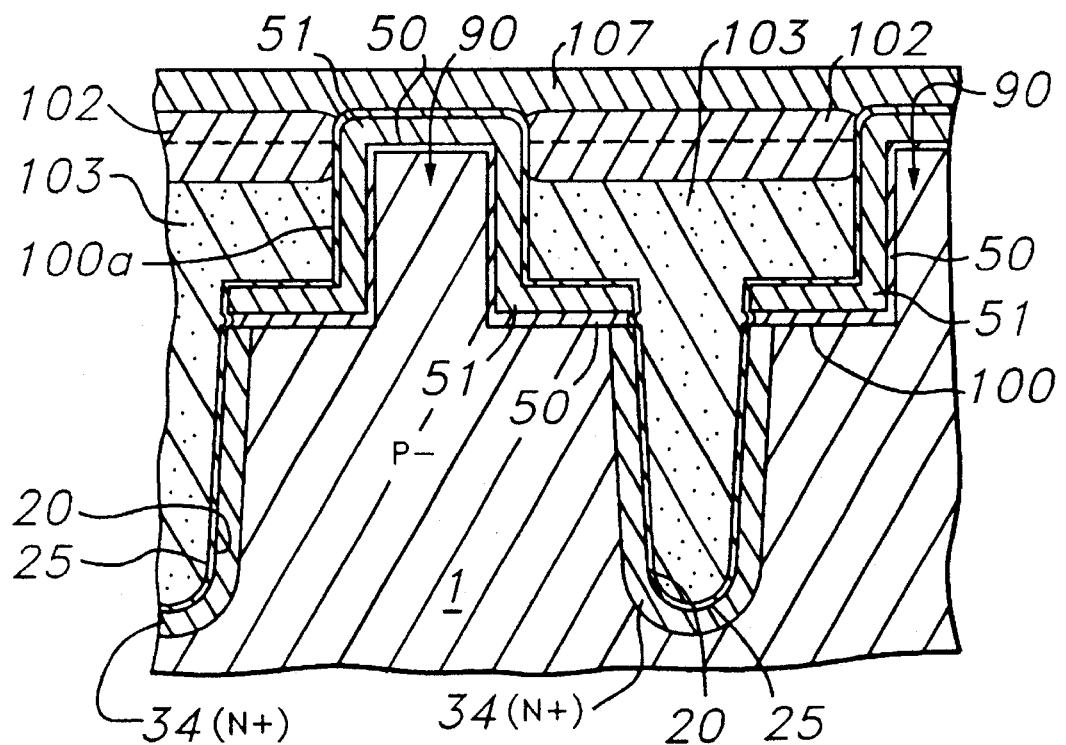
FIG. 22 is a cross section which shows a step in the method for manufacturing the aforementioned RAM in relation to the memory cells.

Next, as shown in FIGS. 12 and 22, an $Si_3N_4$ film (107) is deposited.

Figure 13:
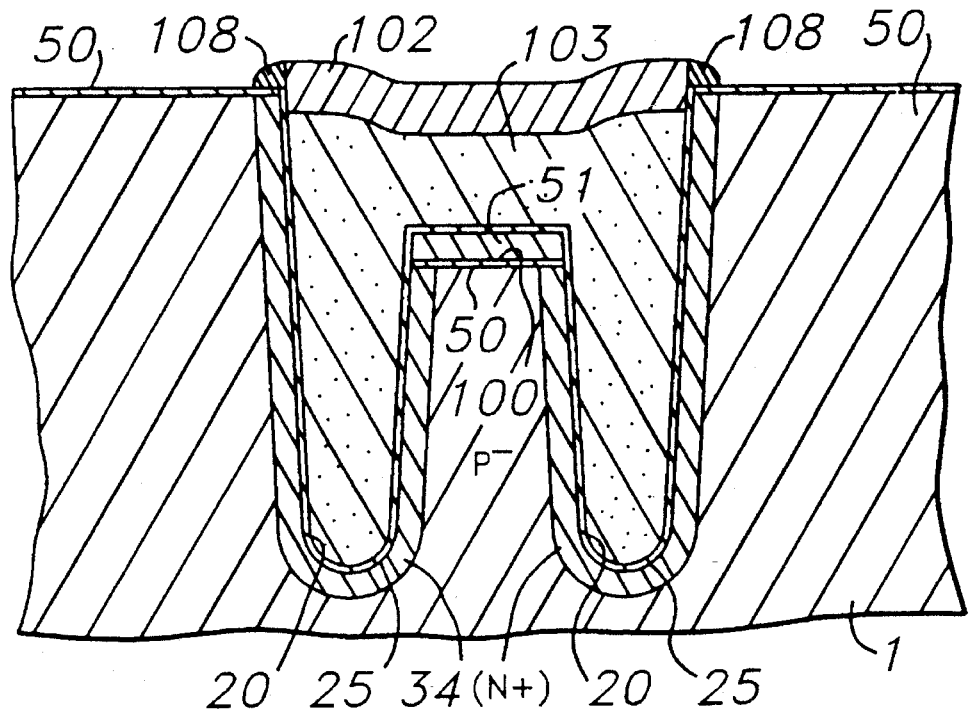
FIG. 13 is a cross section which shows a step in the method for manufacturing the aforementioned RAM in relation to the memory cells.
Figure 23:
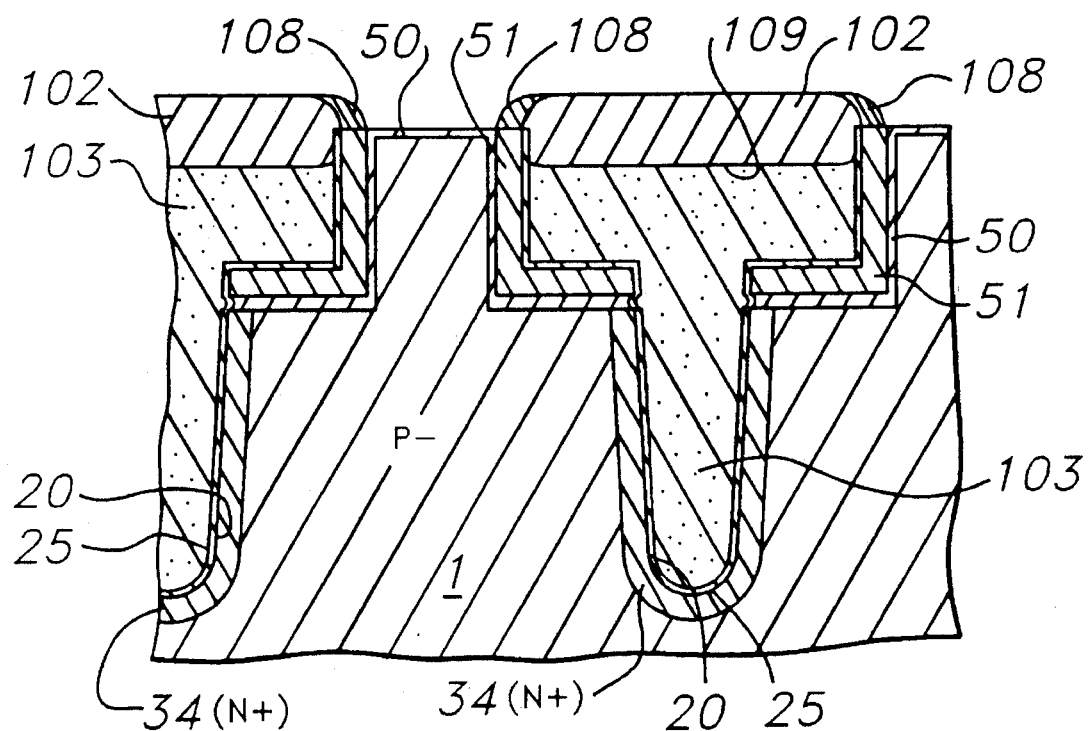
FIG. 23 is a cross section which shows a step in the method for manufacturing the aforementioned RAM in relation to the memory cells.

Next, as shown in FIGS. 13 and 23, this $Si_3N_4$ film is etched back to selectively adhere a film (108), in which $Si_3N_4$ is the main component, to the $SiO_2$ film (102). Thus, it is possible to prevent short-circuiting between the word lines since the $SiO_2$ film (102) retains the polysilicon which is adhered during the polysilicon gate formation (see FIG. 4). In addition, it is possible to position the gate active area (90) precisely.

Figure 14:
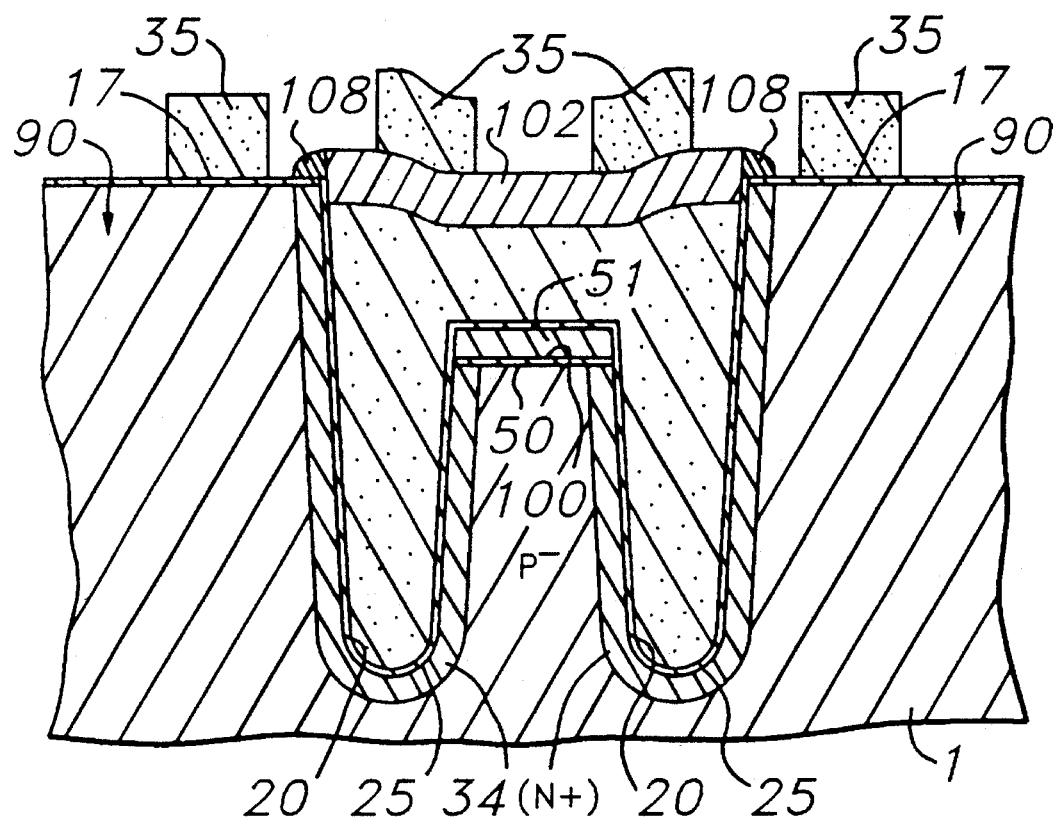
FIG. 14 is a cross section which shows a step in the method for manufacturing the aforementioned RAM in relation to the memory cells.
Figure 24:
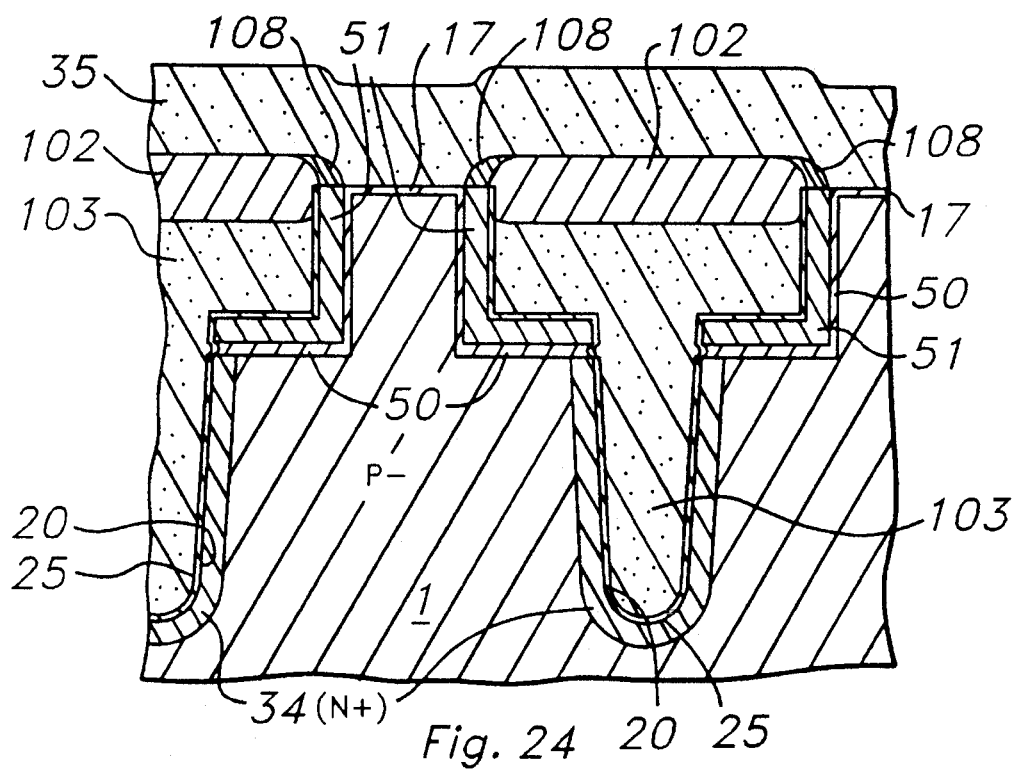
FIG. 24 is a cross section which shows a step in the method for manufacturing the aforementioned RAM in relation to the memory cells.

Next, as shown in FIGS. 14 and 24, the SiO$_2$ film located in the gate active area (90) is removed by etching, after which a thermal oxidation method is used to grow the gate oxide film (17), on top of which a polysilicon is grown by CVD, then etched and patterned to form polysilicon gates (35).

Next, n-type impurity ions (such as As) are injected using the polysilicon gates (35) as masks, thereby forming n$^+$ diffusion areas (22), (23), and (33) inside the substrate (1) to be self aligning. Next, a contact hole is formed in the SiO$_2$ film (53), which has been deposited by CVD over the entire surface. Next, the bit line material is deposited and patterned to form the bit line (41) (see FIGS. 1 and 2).

With the manufacturing method described above, the depression (100) and the groove (20), which extends onto one part of this depression, are linked on the substrate (1). Next, the polysilicon field plate (103) is buried in them, and said polysilicon is oxidized to form an oxide film (102). Thus, the oxide film (102) is restricted to the surrounding wall (100a) of the depression (100), thereby preventing it from projecting out horizontally, and allowing it to grow upward only. Therefore, it is possible to form the field plate (103) in the desired position and it is possible to secure the gate active area (90).

Thus, even after oxidation, the aforementioned buried polysilicon (103) has a sufficiently large cross section area. Thus, line cutting does not occur, and it is even possible to reduce the level difference between the oxide film (102) and gate active area (90), thereby making it possible to flatten the surface.

FIGS. 25–30 show a dynamic RAM (such as a 64 megabite type) which is the second embodiment of the present invention.

Figure 25:
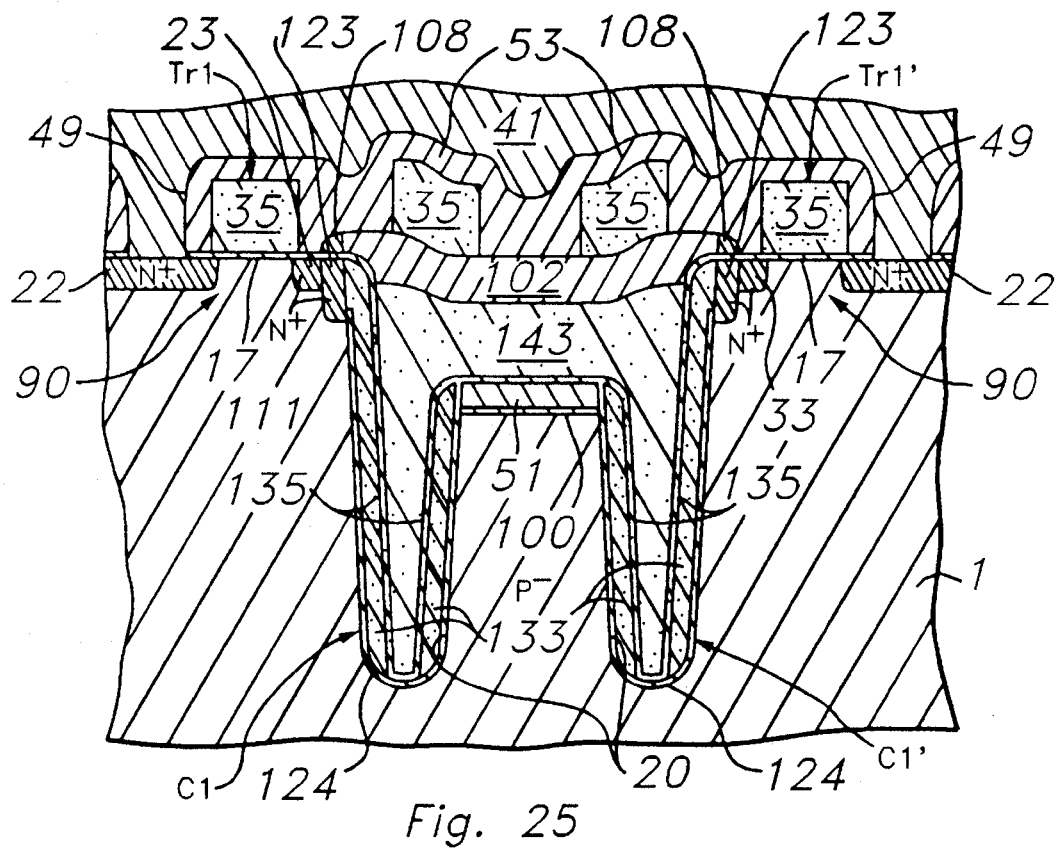
FIG. 25 is a cross section of the major parts of memory cells in the dynamic RAM of the second embodiment of the present invention.

The memory cells of this RAM are the so-called STT (stack in trench) type. As shown in FIG. 25, an insulating film (SiO$_2$ film) (124) is formed to a thickness of approximately 1000 Å over the entire wall surface of the trench-shaped groove (20) except for its top. An n$^+$-type diffusion area (123) is then formed in this top area, where the insulating film is not present, to be linked with the source areas (23) and (33) of the transfer gates Tr$_1$ and Tr$_1$'.

Next, the n$^+$ diffusion area (123) is connected to an n$^+$-type polysilicon electrode (133), which is deposited to the wall surface of the insulating film (124). During this process, the diffusion area (123) is formed by the automatically doping of impurities from the polysilicon electrode (133).

The capacitors C$_1$ and C$_1$' are constructed with an n$^+$-type polysilicon electrode (133)-SiO$_2$ film (135)-n$^+$-type polysilicon electrode (143). The other structures are the same as in FIG. 1. In the figures, (142) is a polysilicon oxide layer.

The characteristics of the STT cell thus produced will now be explained with in relation to the manufacturing method shown in FIGS. 26–30.

Figure 26:
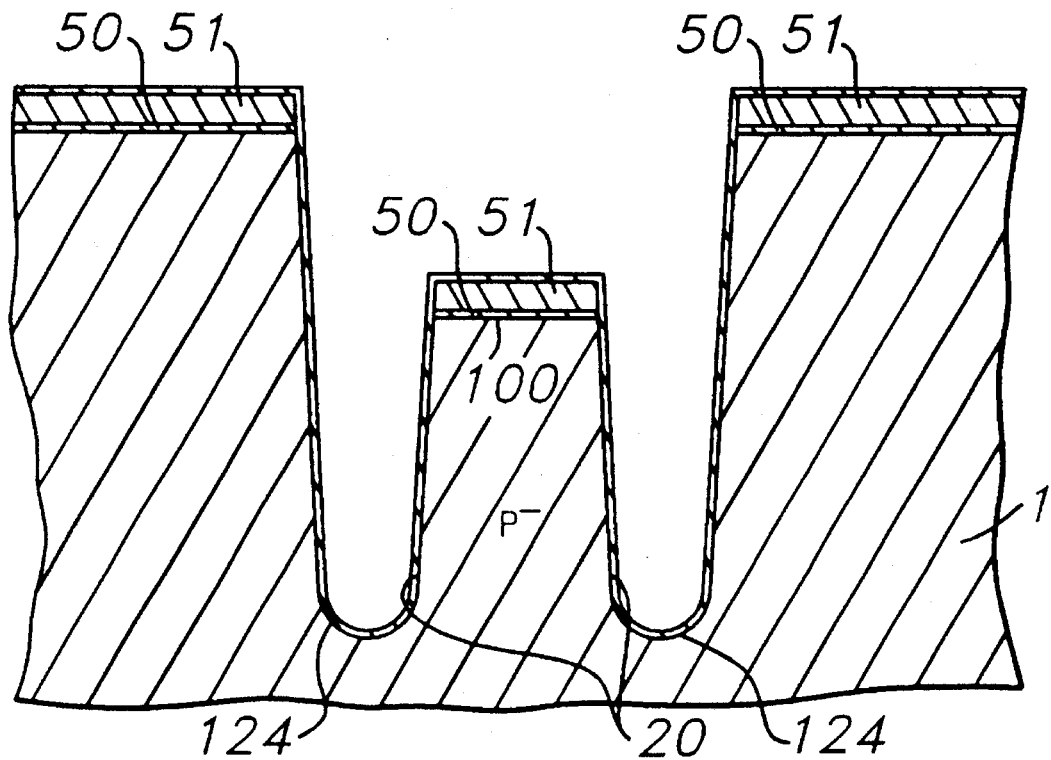
FIG. 26 is a cross section which shows a step in the method for manufacturing the aforementioned RAM in relation to the memory cells.

As shown in FIG. 26, the depression (100) and a groove (20) which is continuous with it are formed on the substrate (1). Next, the SiO$_2$ film (124), having a thickness of approximately 1000 Å, is formed on the wall surface by CVD or a thermal oxidation method.

Figure 27:
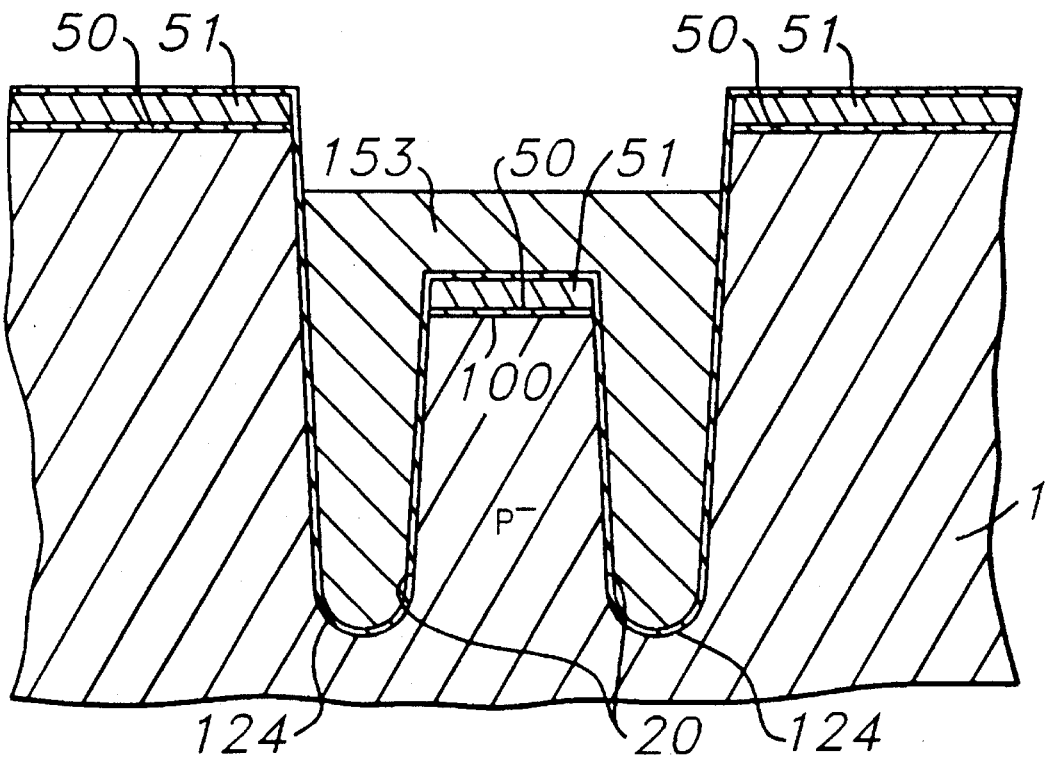
FIG. 27 is a cross section which shows a step in the method for manufacturing the aforementioned RAM in relation to the memory cells.

Next, as shown in FIG. 27, a photoresist (153) is covered to the entire surface, filling the groove (20) and depression (100), after which it is etched back and allowed to remain in the groove (20) and depression (100) at the prescribed depth level. Next, this photoresist (153) is used as a mask in etching the SiO$_2$ film (124), thereby forming an empty area (124a) for the side contact.

Figure 28:
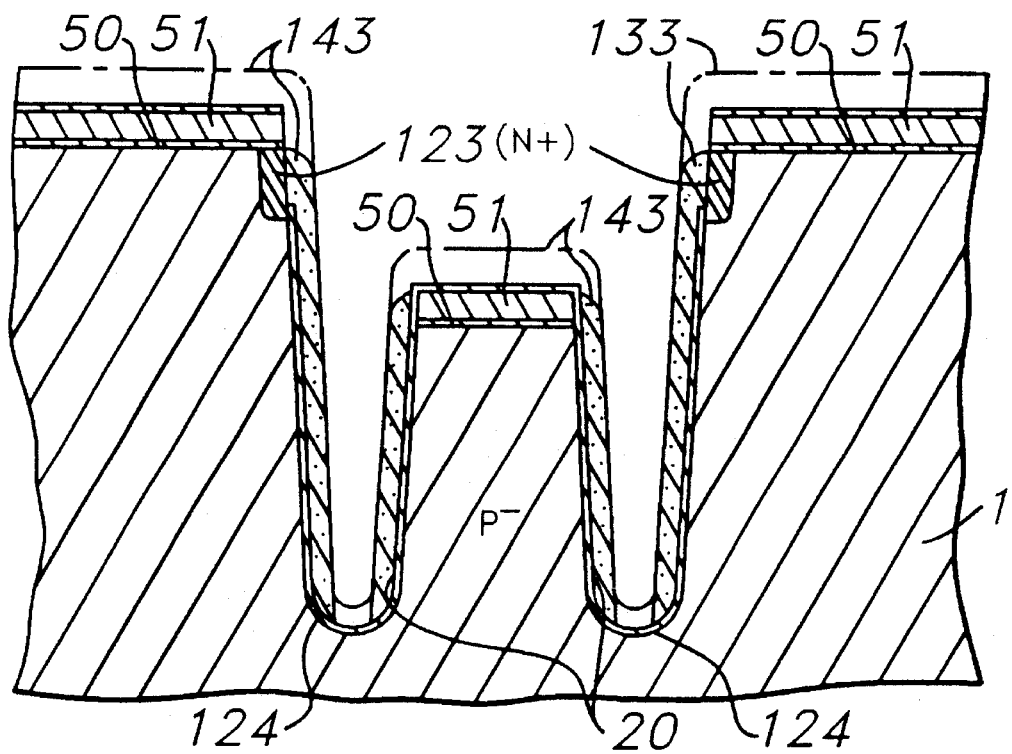
FIG. 28 is a cross section which shows a step in the method for manufacturing the aforementioned RAM in relation to the memory cells.

Next, as shown in FIG. 28, CVD is used to deposit the storage polysilicon layer (133) on the entire surface to a thickness of approximately 500 Å, as shown by the alternate long and short dash line. Next, annealing is performed, thereby automatically doping to the silicon surface area with n-type impurities from the polysilicon film (143) in the side contact area, to form the n$^+$-type diffusion area (123).

Next, as shown in FIG. 28, the polysilicon film (133) is etched back by RIE dry etching to remove the area indicated by the alternate long and short dash line, leaving the remainder as a storage node.

Figure 29:
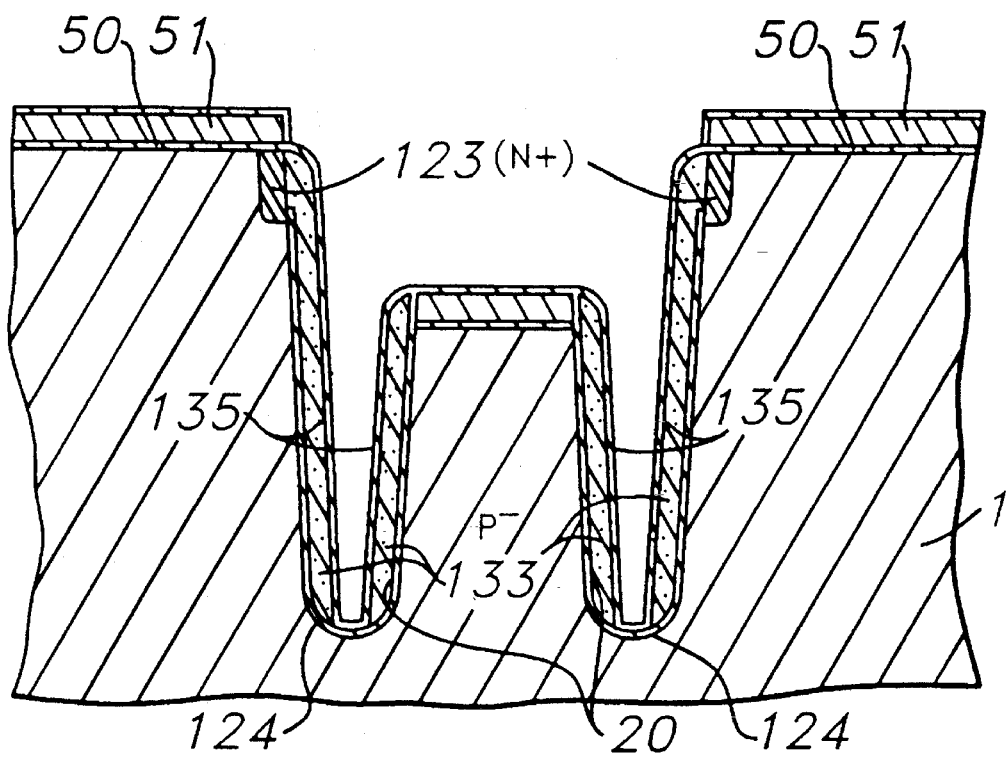
FIG. 29 is a cross section which shows a step in the method for manufacturing the aforementioned RAM in relation to the memory cells.

Next, as shown in FIG. 29, CVD is used to grow an SiO$_2$ film (135) over the entire surface (including the inside of the groove (20)).

Figure 30:
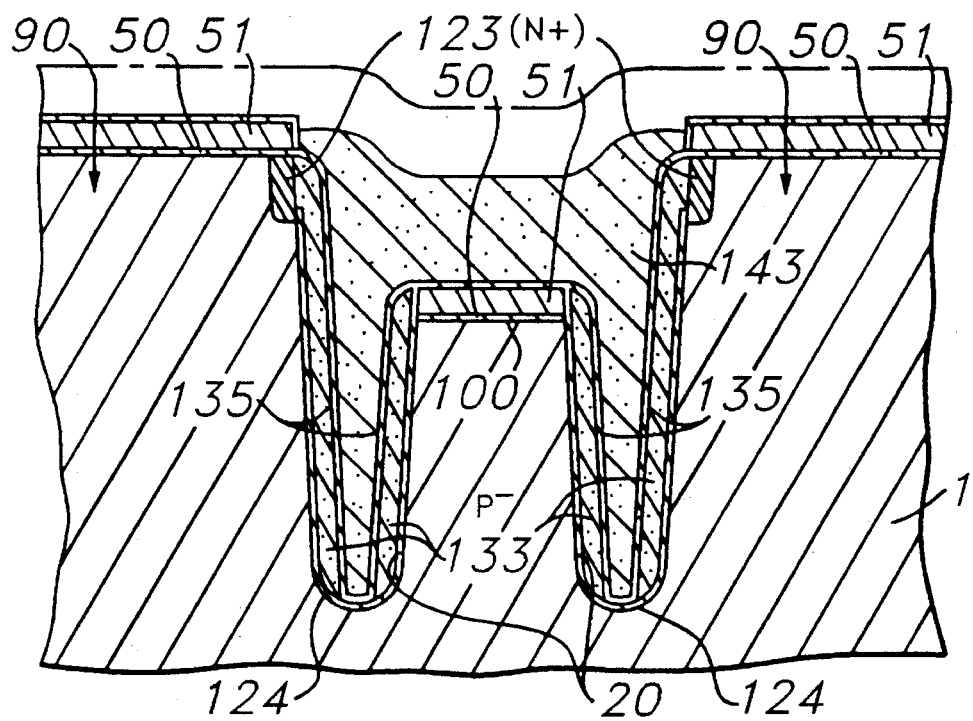
FIG. 30 is a cross section which shows a step in the method for manufacturing the aforementioned RAM in relation to the memory cells.

Next, as shown in FIG. 30, CVD is used to deposit a polysilicon layer (143) over the entire surface, including the groove (20) and depression (100), after which the area indicated by the alternate long and short dash line is etched back by RIE dry etching in the same manner as above up to the top of the groove (20).

Next, as shown in FIG. 25, a thermal oxidation technology is used to oxidized the surface of the polysilicon layer (143), thereby growing an SiO$_2$ layer (142). The following processes will not be explained since they are the same as those described above.

Thus, even with STT cells, the oxide (142) of the polysilicon layer (143) is prevented from projecting horizontally by the depression (100), which is situated to be linked with the groove (20). Thus, it is possible to form the desired gate active area (90) at all times according to designs. In addition, in the same manner as the aforementioned embodiment, it is possible to obtain the effects of a flattened surface and prevention of line cutting on the field plate.

The present invention has thus been explained in relation to embodiments. However, it is also possible to make a variety of alterations in the above application examples, based on the technological ideas of the present invention.

For example, it is possible to make a variety of alterations in the patterns, range, etc. of the aforementioned depression (100). In addition, formation method is not restricted to the aforementioned examples. The groove (20) may also be entirely contained in the depression (100).

In addition, it is also possible to use conductive materials other than polysilicon as the material for the aforementioned field plate.

Although a nitride was situated below the field plate to isolate the elements in the aforementioned examples, it is also possible to use an SiO$_2$ alone, in the same manner as a LOCOS structure.

It is also possible to make a variety of alterations in the materials, etc. of the aforementioned areas, and it is also possible to reverse the conductive types of the semiconductor areas.

The present invention can of course be applied to semiconductor integrated circuit elements other than dynamic RAMs which have the structure described above.

As described above, with the present invention, a conductor is buried in a first and second depression, on top of which an insulating film is then formed, the bottom of which insulating film is formed inside of the first depression. Thus, it is possible to prevent the insulating film from projecting horizontally during the insulating film formation procedure. As a result, in the following procedures, it is possible to form Si$_3$N$_4$, etc. according to designs using a side wall technology, thereby making it possible to secure the element active area according to designs.

In addition, since the aforementioned conductor is buried inside the first and second depressions, it can be allowed to remain by etching back without patterning by etching. Thus, the conductor is continuous over a sufficiently large cross section area, even if its top is converted to an insulator, thereby preventing short-circuits.

In addition, since there is not a large difference in level between the aforementioned insulating film and element active area, it is possible to flatten the surface in comparison with the conventional structure, wiring formation is made simpler, and it is possible to prevent the problems of wiring cutting.

What we claim is:

1. A method for manufacturing a semiconductor device, which comprises the steps of:

forming a first depression within an uppermost surface of a semiconductor device;

forming a second depression continuous with the first depression and to be deeper than the first depression;

burying a conductor in the first and second depressions to a level which is lower than the uppermost surface of the semiconductor substrate surface; and forming an insulating film on top of the conductor such that said insulating film abuts said conductor at a level below said uppermost surface of said semiconductor device.

2. The method of claim 1 wherein said semiconductor substrate comprises a silicon substrate and said step of forming said insulating film comprises forming a silicon dioxide film.

3. The method of claim 1 and further comprising the steps of:

forming a first doped region in said semiconductor substrate adjacent said second depression;

forming a second doped region in said semiconductor substrate and spaced from said first doped region by a channel region; and forming a conductive region overlying said channel region.

4. The method of claim 1 wherein said step of forming a second depression further comprises forming a third depression within said uppermost surface, said first depression continuous with said first depression and spaced from said second depression by said first depression.

5. The method of claim 1 and further comprising forming an insulating layer within said first and second depressions prior to said step of burying a conductor.

6. The method of claim 1 wherein step of forming a second depression comprises forming said second depression through said first depression.

7. The method of claim 1 wherein the portion of said conductor within said first depression abuts the portion of said conductor within said second depression.

8. A method of forming a memory cell within a semiconductor layer which includes a top surface, said method comprising the steps of:

forming a first depression in said semiconductor layer such that said first depression is disposed within said semiconductor layer below said top surface;

forming a second depression continuous to said first depression within said semiconductor layer, said second depression formed deeper than said first depression;

forming a first doped region in said semiconductor layer adjacent said second depression;

forming an insulating layer within said first and second depressions;

forming a conductor adjacent said insulating layer within said first and second depressions;

forming an insulating film on top of said conductor at an interface wherein said interface is formed inside said first depression below said top surface;

forming a second doped region in said semiconductor layer and spaced from said first doped region by a channel region; and forming a gate over said channel region.

9. The method of claim 8 wherein said steps of forming first and second doped regions comprise forming n-doped regions.

10. The method of claim 8 wherein said first doped region is formed within said semiconductor layer.

11. The method of claim 8 wherein said step of forming a first doped region comprises forming a polysilicon region within said second depression and insulated from said conductor by said insulating layer.

12. A method of forming a semiconductor device within a semiconductor layer which includes a top surface, said method comprising the steps of:

forming a first depression in said semiconductor layer and extending below said top surface;

forming a second depression in said semiconductor layer and linked to said first depression, said second depression formed deeper than said first depression;

forming a first conductor within said second depression thereby creating a third depression within said second depression;

forming a second conductor within said first and third depressions, said second conductor insulated from said first conductor; and forming an insulating film on top of said second conductor at an interface wherein the interface between the insulating film and the second conductor is formed inside the first depression.

13. The method of claim 12 and further comprising the steps of:

forming a first doped region in said semiconductor layer and abutting said first conductor;

forming a second doped region in said semiconductor layer and spaced from said first doped region by a channel region; and forming a gate over said channel region.

14. A method of forming a memory cell within a semiconductor layer which includes an uppermost surface, said method comprising the steps of:

forming a shallow depression within said semiconductor layer, said shallow depression having a sidewall;

etching a portion of said semiconductor layer adjacent said shallow depression sidewall thereby forming a deep trench which overlaps said shallow depression, said deep trench extending further within said semiconductor layer than said shallow depression;

forming a first conductive layer along a sidewall within said deep trench;

forming a dielectric layer over said first conductive layer within said deep trench;

forming a second conductive layer within said shallow depression and said deep trench, said second conductive layer having an uppermost surface disposed below said uppermost surface of said semiconductor layer;

forming an insulating layer over said second conductive layer;

forming a gate overlying a channel region within said semiconductor layer and spaced from said deep trench; and forming a first and second doped regions within said semiconductor layer adjacent said gate, said first doped region formed adjacent said deep trench and said second doped region spaced from said doped region by said channel region.

15. The method of claim 14 wherein:

said shallow depression is between about 3000 and 6000 Å deep; and said deep trench is between about 3 and 5 μm deep.

16. The method of claim 14 wherein said shallow depression is formed by a reactive ion etching process.

17. The method of claim 14 wherein said step of forming a second conductive layer within said shallow depression and said deep trench comprises depositing polysilicon.

18. The method of claim 17 wherein said step of forming a second conductive layer within said shallow depression and said deep trench comprises the steps of:

depositing a polysilicon layer over said uppermost surface of said semiconductor layer outside said shallow depression and said deep trench; and etching back said polysilicon layer such that said polysilicon layer has an uppermost surface disposed below said uppermost surface of said semiconductor layer.

19. The method of claim 14 wherein said step of forming an insulating layer over said conductive region comprises the steps of forming an oxide layer followed by forming a nitride layer over said oxide layer.

20. The method of claim 14 wherein said etching step further comprises forming a second deep trench which overlaps said shallow depression and is spaced from said deep trench, said second deep trench extending further within said semiconductor layer than said shallow depression.

21. The method of claim 14 wherein said step of forming a conductive layer along a sidewall within said deep trench comprises doping said sidewall.

22. The method of claim 14 wherein said step of forming a conductive layer along a sidewall within said deep trench comprises forming an insulating layer along said sidewall followed by forming a conductive layer along said insulating layer.

23. A method of making a semiconductor storage device comprising the steps of:

forming a first groove in a semiconductor substrate of one conductive type;

forming a second groove deeper than the first groove, said second groove being stacked within said first groove;

forming an insulating film within said second groove, said insulating film provided so as to expose a portion of said substrate;

forming an accumulating electrode along the walls of said second groove wherein said accumulating electrode is brought into contact with the substrate at said portion which was exposed;

adding impurities of the conductive type opposite that of the substrate to the substrate in said exposed section;

burying an electrode in said first and second grooves wherein said electrode and said accumulating electrode are separated by a capacitor insulating film; and providing a MOS transistor within said substrate wherein, said MOS transistor includes first and second source/drain regions of said opposite conductive type, wherein said first source/drain region contacts said accumulating electrode.

* * * * *